United States Patent
Jun et al.

(10) Patent No.: US 12,087,815 B2
(45) Date of Patent: *Sep. 10, 2024

(54) CROSSING MULTI-STACK NANOSHEET STRUCTURE AND METHOD OF MANUFACTURING THE SAME

(71) Applicant: SAMSUNG ELECTRONICS CO., LTD., Suwon-si (KR)

(72) Inventors: Hwichan Jun, Albany, NY (US); Inchan Hwang, Schenectady, NY (US); Byounghak Hong, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/187,506

(22) Filed: Mar. 21, 2023

(65) Prior Publication Data
US 2023/0231015 A1    Jul. 20, 2023

Related U.S. Application Data

(63) Continuation of application No. 17/148,252, filed on Jan. 13, 2021, now Pat. No. 11,670,677.

(Continued)

(51) Int. Cl.
*H01L 29/06*    (2006.01)
*H01L 27/088*   (2006.01)
(Continued)

(52) U.S. Cl.
CPC ........ *H01L 29/0665* (2013.01); *H01L 27/088* (2013.01); *H01L 29/401* (2013.01);
(Continued)

(58) Field of Classification Search
CPC . H01L 29/0665; H01L 27/088; H01L 29/401; H01L 29/41733; H01L 29/42392;
(Continued)

(56) References Cited

U.S. PATENT DOCUMENTS 10,510,622 B1    12/2019    Frougier et al.
10,629,538 B2     4/2020    Zhang
(Continued)

FOREIGN PATENT DOCUMENTS

| EP | 3 588 544 A1 | 1/2020 |
| TW | 202008507 A | 2/2020 |
| WO | 2014/209278 A1 | 12/2014 |

OTHER PUBLICATIONS

Communication dated Sep. 10, 2021, issued by the European Patent Office in counterpart European Application No. 21167881.8.
(Continued)

*Primary Examiner* — Tong-Ho Kim
(74) *Attorney, Agent, or Firm* — Sughrue Mion, PLLC

(57) ABSTRACT

A semiconductor device includes a substrate; a $1^{st}$ transistor formed above the substrate, and having a $1^{st}$ transistor stack including a plurality of $1^{st}$ channel structures, a $1^{st}$ gate structure surrounding the $1^{st}$ channel structures, and $1^{st}$ and $2^{nd}$ source/drain regions at both ends of the $1^{st}$ transistor stack in a $1^{st}$ channel length direction; and a $2^{nd}$ transistor formed above the $1^{st}$ transistor in a vertical direction, and having a $2^{nd}$ transistor stack including a plurality of $2^{nd}$ channel structures, a $2^{nd}$ gate structure surrounding the $2^{nd}$ channel structures, and $3^{rd}$ and $4^{th}$ source/drain regions at both ends of the $2^{nd}$ transistor stack in a $2^{nd}$ channel length direction, wherein the $3^{rd}$ source/drain region does not vertically overlap the $1^{st}$ source/drain region or the $2^{nd}$ source/drain region, and the $4^{th}$ source/drain region does not vertically overlap the $1^{st}$ source/drain region or the $2^{nd}$ source/drain region.

11 Claims, 14 Drawing Sheets

Related U.S. Application Data

(60) Provisional application No. 63/086,763, filed on Oct. 2, 2020.

(51) Int. Cl.
  *H01L 29/40* (2006.01)
  *H01L 29/417* (2006.01)
  *H01L 29/423* (2006.01)
  *H01L 29/66* (2006.01)
  *H01L 29/786* (2006.01)

(52) U.S. Cl.
  CPC .. *H01L 29/41733* (2013.01); *H01L 29/42392* (2013.01); *H01L 29/66545* (2013.01); *H01L 29/66742* (2013.01); *H01L 29/78696* (2013.01)

(58) Field of Classification Search
  CPC ......... H01L 29/66545; H01L 29/66742; H01L 29/78696; H01L 21/82345; H01L 21/8221; H01L 21/823418; H01L 21/823475; H01L 21/823814; H01L 21/823842; H01L 21/823871; H01L 27/092; H01L 27/0688; H01L 27/0886; H01L 29/1033; H01L 29/785; H01L 21/823807; H01L 21/823828; H01L 21/823857; H01L 29/0673
  USPC ....................................................... 257/288
  See application file for complete search history.

(56) References Cited

U.S. PATENT DOCUMENTS

| | | | |
|---|---|---|---|
| 10,658,462 | B2 | 5/2020 | Lee et al. |
| 10,734,224 | B2 | 8/2020 | Smith et al. |
| 10,734,384 | B1 | 8/2020 | Li et al. |
| 10,741,456 | B2 | 8/2020 | Cheng et al. |
| 11,670,677 | B2 * | 6/2023 | Jun ................. H01L 21/823418 257/288 |
| 2011/0140178 | A1 | 6/2011 | Vincent |
| 2019/0172828 | A1 | 6/2019 | Smith et al. |
| 2019/0319021 | A1 | 10/2019 | Xu et al. |
| 2020/0075489 | A1 | 3/2020 | Liebmann et al. |
| 2020/0075574 | A1 | 3/2020 | Smith et al. |
| 2020/0203341 | A1 | 6/2020 | Barraud et al. |
| 2020/0219970 | A1 | 7/2020 | Mannebach et al. |
| 2020/0235098 | A1 | 7/2020 | Li et al. |
| 2020/0294969 | A1 | 9/2020 | Rachmady et al. |
| 2021/0074350 | A1 | 3/2021 | Vincent et al. |
| 2021/0376137 | A1 | 12/2021 | Yang et al. |
| 2022/0013521 | A1 | 1/2022 | Zhang et al. |
| 2022/0059414 | A1 | 2/2022 | Yang et al. |

OTHER PUBLICATIONS

Notice Of Allowance issued on Apr. 12, 2024 issued by the Taiwanese Patent Office in corresponding TW Patent Application No. 110112941.

Notice of Allowance dated Jul. 16, 2024, issued by the European Patent Office in counterpart European Application No. 21167881.8.

* cited by examiner

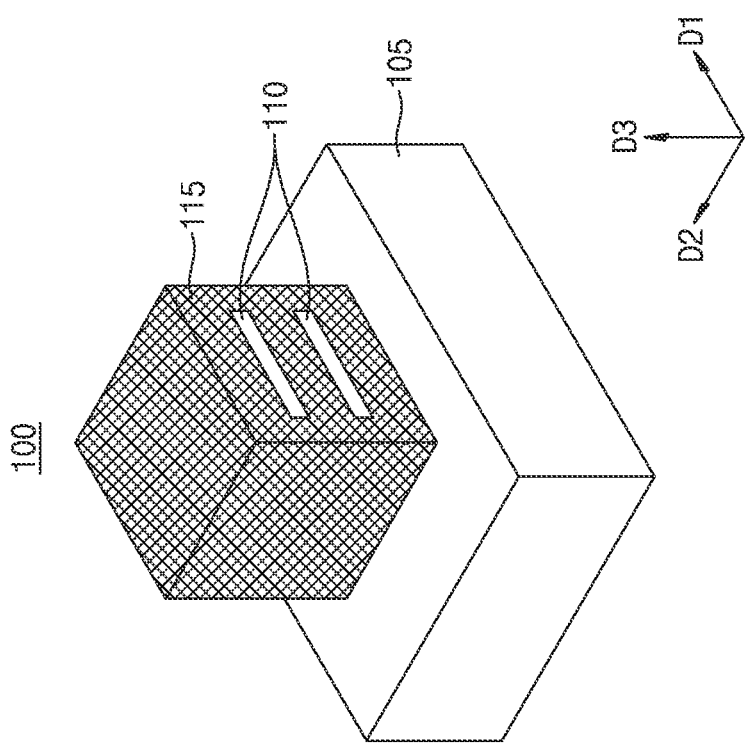

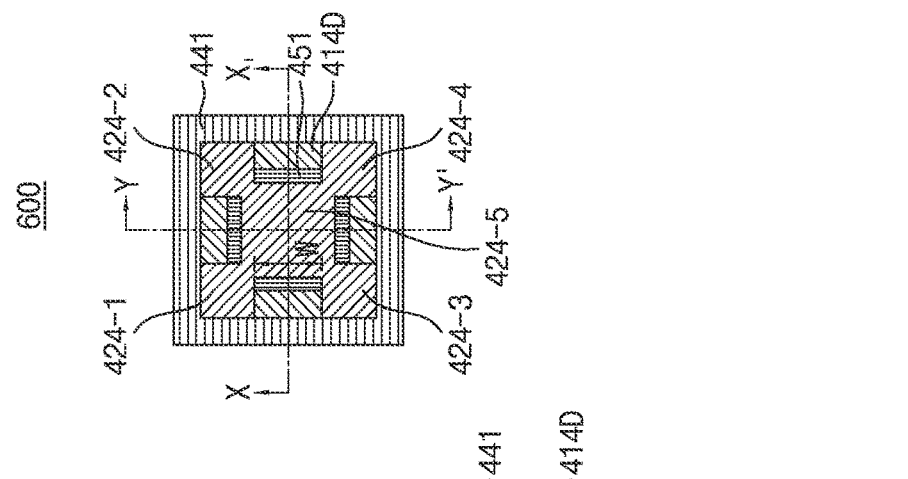
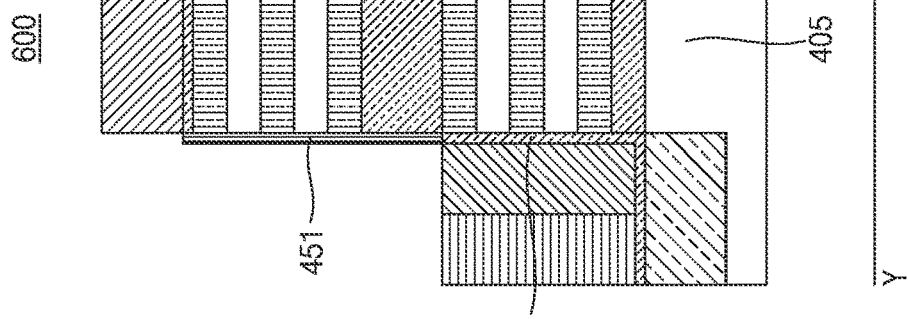
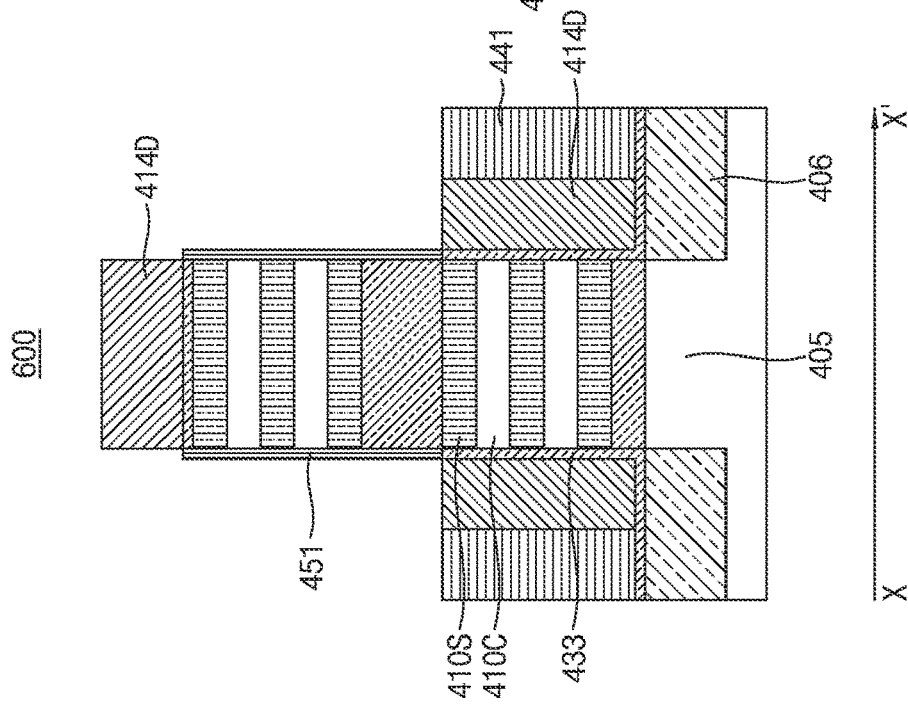

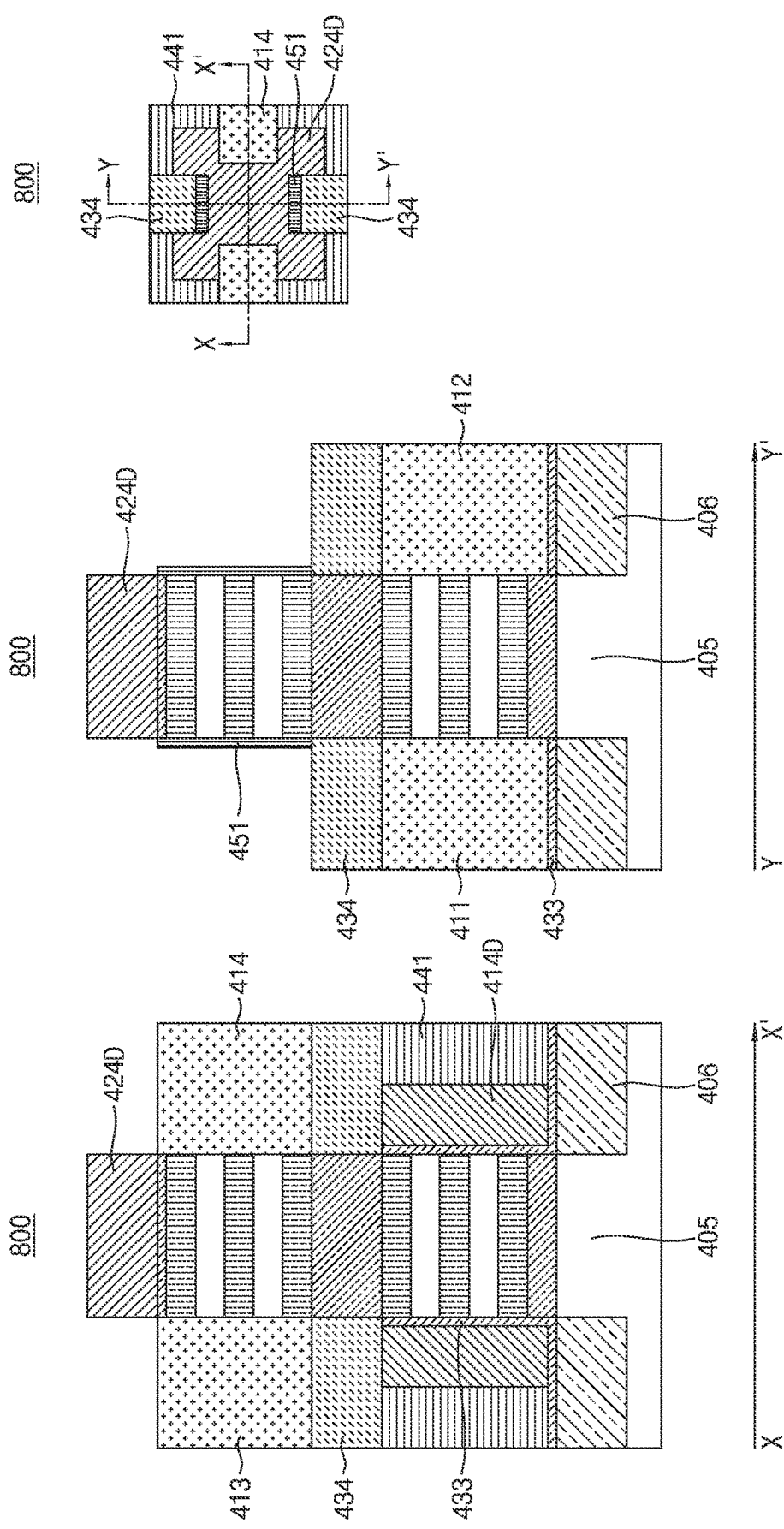

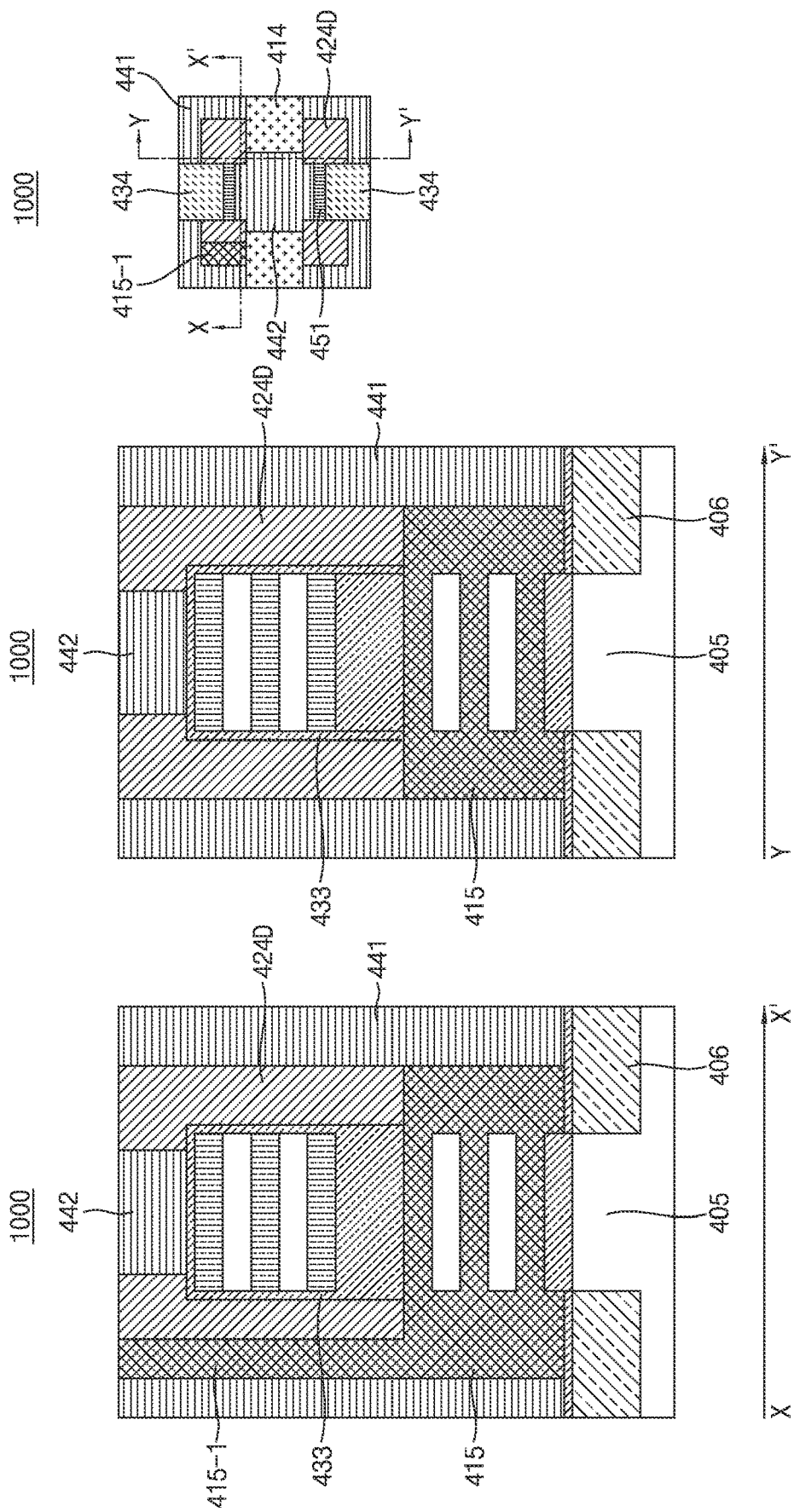

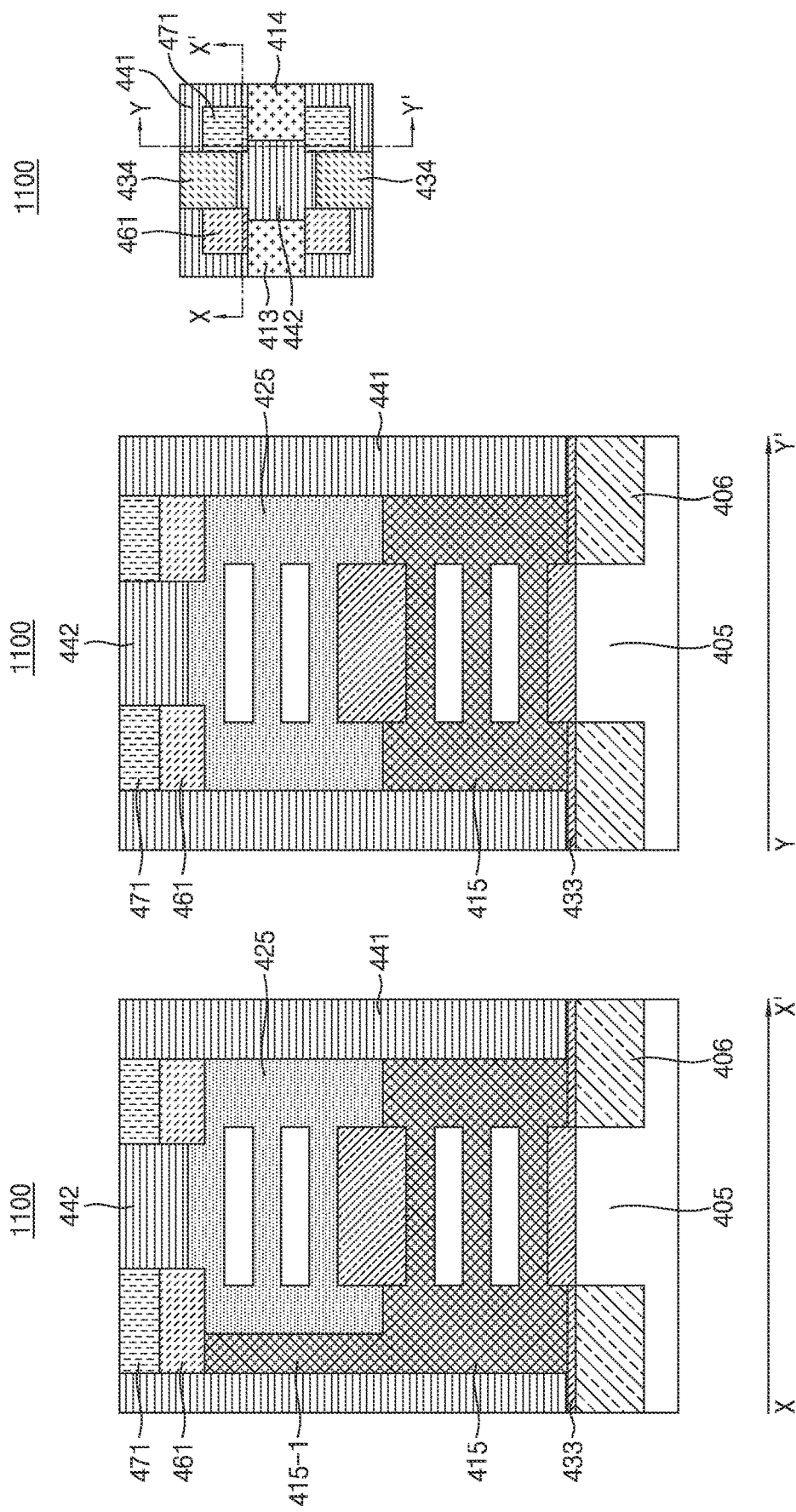

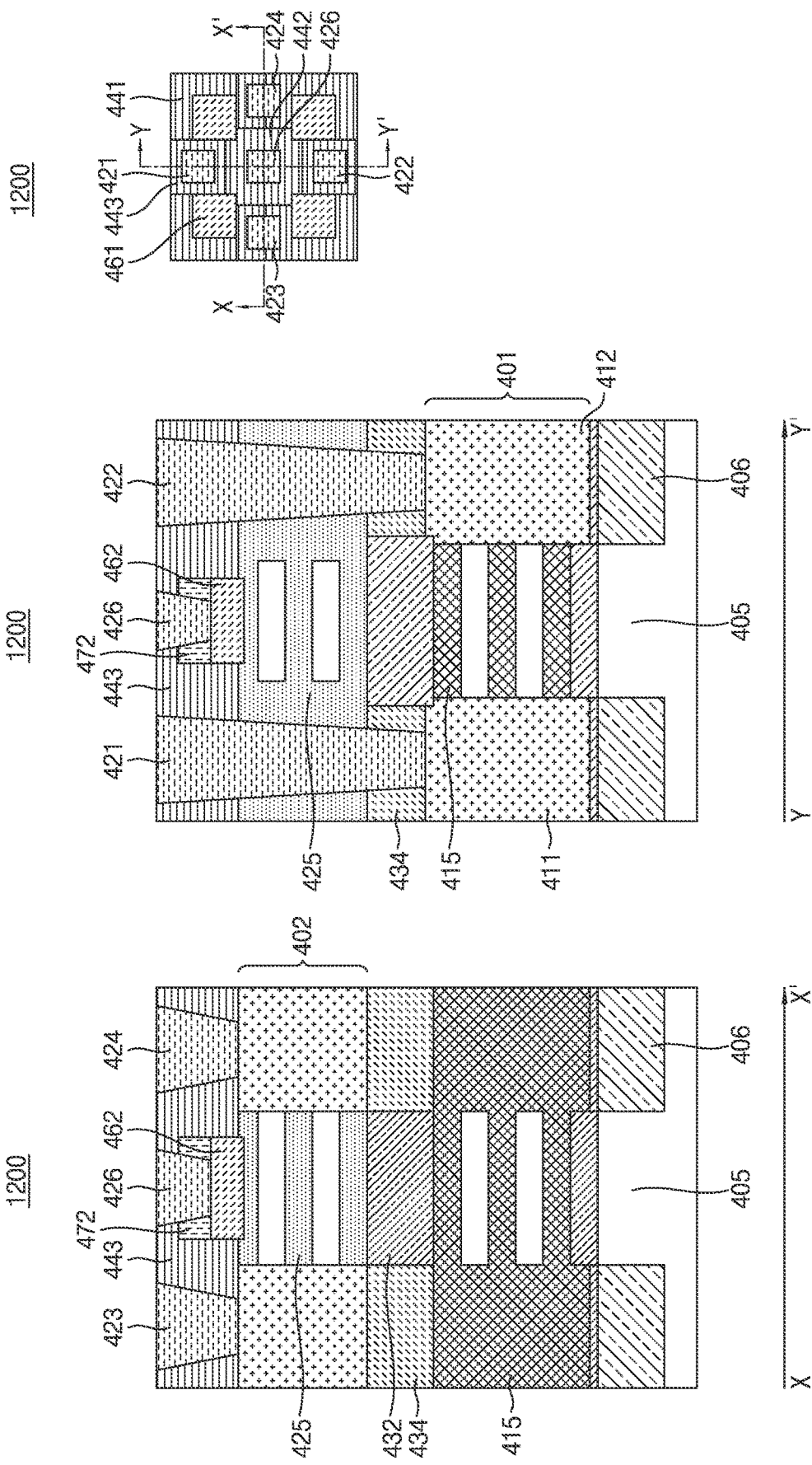

CROSSING MULTI-STACK NANOSHEET STRUCTURE AND METHOD OF MANUFACTURING THE SAME

CROSS-REFERENCE TO THE RELATED APPLICATION

This is a Continuation of U.S. application Ser. No. 17/148,252 filed Jan. 13, 2021, which is based on and claims priority from U.S. Provisional Application No. 63/086,763 filed on Oct. 2, 2020 in the U.S. Patent and Trademark Office, the disclosure of which is incorporated herein in its entirety by reference.

BACKGROUND

1. Field

Apparatuses and methods consistent with example embodiments of the inventive concept relate to a semiconductor device structure and, more particularly, to a semiconductor device structure having a crossing multi-stack nanosheet structure.

2. Description of the Related Art

Growing demand for miniaturization of semiconductor devices has introduced a nanosheet transistor characterized by multiple nanosheet layers bridging source/drain regions formed at both ends thereof and a gate structure that entirely wraps around all sides of the nanosheet layers. These nanosheet layers function as multiple channels for current flow between the source/drain regions of the nanosheet transistor. Due to this structure, improved control of current flow through the multiple channels is enabled in addition to higher device density in a semiconductor device including the nanosheet transistor. The nanosheet transistor is also referred to as various different names such as multi-bridge channel FET (MBCFET), nanobeam, nanoribbon, superimposed channel device, etc.

FIG. 1 illustrates a related art nanosheet structure for a semiconductor device. A nanosheet structure 100 shown in FIG. 1 includes two or more nanosheet layers 110 which are vertically stacked above a substrate 105 in an overlapping manner in a D3 direction. The nanosheet layers 110, functioning as channels of a transistor formed by the nanosheet structure 100, are completely surrounded by a gate structure 115 except at their open ends formed at two opposite sides of the gate structure 115 where source/drain regions are to be grown to complete the nanosheet structure 100 as a single transistor such as a nanosheet metal-oxide-semiconductor FET (MOSFET). That is, the nanosheet structure of FIG. 1 enables a single transistor having multiple channels between source/drain regions unlike the conventional planar FET or finFET having a single layer or a single fin channel structure. In FIG. 1A, source/drain regions are intentionally omitted from the nanosheet structure 100 only to show how the nanosheet layers 110 take a form of respectively penetrating the gate structures 115 in a D2 direction which is a channel length direction of the nanosheet structure 100.

The substrate 105 may be a bulk substrate of a semiconductor material, for example, silicon (Si), or a silicon-on-insulator (SOI) substrate, the nanosheet layers 110 may also be formed of Si, and the gate structure 115 may be formed of a conductor metal and a gate dielectric layer. The conductor metal may be tungsten (W) or aluminum (Al), and the dielectric may include silicon oxide (SiO) or metal silicate for electrical insulation from the nanosheet layers 110.

However, technology to reduce the size of a single transistor is limited even if the transistor is formed of multiple channel layers like the nanosheet layers 110.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

The disclosure provides a multi-stack nanosheet structure having two or more nanosheet stacks having different channel directions and methods of manufacturing the multi-stack nanosheet structure.

According to embodiments, there is provided a semiconductor device which may include a substrate; a $1^{st}$ transistor formed above the substrate, and having a $1^{st}$ transistor stack including a plurality of $1^{st}$ channel structures, a $1^{st}$ gate structure surrounding the $1^{st}$ channel structures, and $1^{st}$ and $2^{nd}$ source/drain regions at both ends of the $1^{st}$ transistor stack in a $1^{st}$ channel length direction; and a $2^{nd}$ transistor formed above the $1^{st}$ transistor in a vertical direction, and having a $2^{nd}$ transistor stack including a plurality of $2^{nd}$ channel structures, a $2^{nd}$ gate structure surrounding the $2^{nd}$ channel structures, and $3^{rd}$ and $4^{th}$ source/drain regions at both ends of the $2^{nd}$ transistor stack in a $2^{nd}$ channel length direction, wherein the $3^{rd}$ source/drain region does not vertically overlap the $1^{st}$ source/drain region or the $2^{nd}$ source/drain region, and the $4^{th}$ source/drain region does not vertically overlap the $1^{st}$ source/drain region or the $2^{nd}$ source/drain region.

According to embodiments, there is provided a transistor structure which may include: $1^{st}$ transistor stack and a $2^{nd}$ transistor stack formed above the $1^{st}$ transistor stack, wherein the $1^{st}$ transistor stack includes a plurality of $1^{st}$ channel structures surrounded by a $1^{st}$ gate structure, and the $2^{nd}$ transistor stack includes a plurality of $2^{nd}$ channel structures surrounded by a $2^{nd}$ gate structure, wherein the $1^{st}$ channel structures are configured to form $1^{st}$ channels for a $1^{st}$ current flow in the $1^{st}$ channel length direction, and the $2^{nd}$ channel structures are configured to form $2^{nd}$ channels for a $2^{nd}$ current flow in the $2^{nd}$ channel length direction, and wherein the $1^{st}$ and $2^{nd}$ channel length directions are different from each other.

According to embodiments, there is provided a method of manufacturing a semiconductor device. The method may include following operations of: (a) providing a semiconductor device structure comprising a substrate, $1^{st}$ transistor stack formed on the substrate, and a $2^{nd}$ transistor stack formed on the $1^{st}$ transistor stack, wherein the $1^{st}$ and $2^{nd}$ transistor stacks comprise a plurality of $1^{st}$ and $2^{nd}$ channel structures, respectively; (b) forming a $1^{st}$ dummy gate to surround the $1^{st}$ transistor stack, and forming a $2^{nd}$ dummy gate on the $1^{st}$ dummy gate to surround the $2^{nd}$ transistor stack and a top surface of the $2^{nd}$ transistor stack; (c) removing the $1^{st}$ dummy gate on at least parts of at least $1^{st}$ and $2^{nd}$ sides among four sides of the $1^{st}$ transistor stack, and forming $1^{st}$ and $2^{nd}$ source/drain regions on the $1^{st}$ and $2^{nd}$ sides of the $1^{st}$ transistor stack, respectively, where the $1^{st}$ dummy gate is removed; (d) removing the $2^{nd}$ dummy gate on at least parts of at least $3^{rd}$ and $4^{th}$ sides among four sides of the $2^{nd}$ transistor stack, and forming $3^{rd}$ and $4^{th}$ source/ drain regions on the 3rd and 4th sides of the 2nd transistor stack, respectively, where the 2nd dummy gate is removed; and (e) removing and replacing the remaining 1st and 2nd dummy gates with 1st and 2nd replacement metal gates, respectively, to form 1st and 2nd gate structures surrounding the 1st and 2nd channel structures, respectively, wherein the 1st to 4th source/drain regions are formed such that the 3rd source/drain region does not overlap the 1st source/drain region or the 2nd source/drain region, and the 4th source/drain region does not overlap the 1st source/drain region or the 2nd source/drain region.

The disclosed crossing multi-stack nanosheet structure may enable to have source/drain contact structures to land on top surfaces of source/drain regions of a lower nanosheet stack instead of side surfaces thereof, and reduce parasitic capacitance between the source/drain contact structures and source/drain regions of an upper nanosheet stack.

BRIEF DESCRIPTION OF THE DRAWINGS

Example embodiments of the inventive concept will be more clearly understood from the following detailed description taken in conjunction with the accompanying drawings in which:

FIG. 1 illustrates a related art nanosheet structure for a semiconductor device;

FIGS. 6A to 6C illustrate two cross-sectional views and a plan view of a semiconductor device, respectively, in which parts of a dummy gate enclosing an upper nanosheet stack are patterned, according to an embodiment;

FIGS. 8A to 8C illustrate two cross-sectional views and a top plan view of a semiconductor device, respectively, in which source/drain regions are grown on an upper nanosheet stack, according to an embodiment;

FIGS. 10A to 10C illustrate two cross-sectional views and a top plan view of a semiconductor device, respectively, in which a replacement metal gate is formed to surround nanosheet layers of a lower nanosheet stack, according to an embodiment;

FIGS. 11A to 11C illustrate two cross-sectional views and a top plan view of a semiconductor device, respectively, in which a replacement metal gate is formed to surround nanosheet layers of an upper nanosheet stack, according to an embodiment;

FIGS. 12A to 12C illustrate two cross-sectional views and a top plan view of a semiconductor device, respectively, in which source/drain contact structures are formed, according to an embodiment;

DETAILED DESCRIPTION OF THE EMBODIMENTS

Figure 2B:
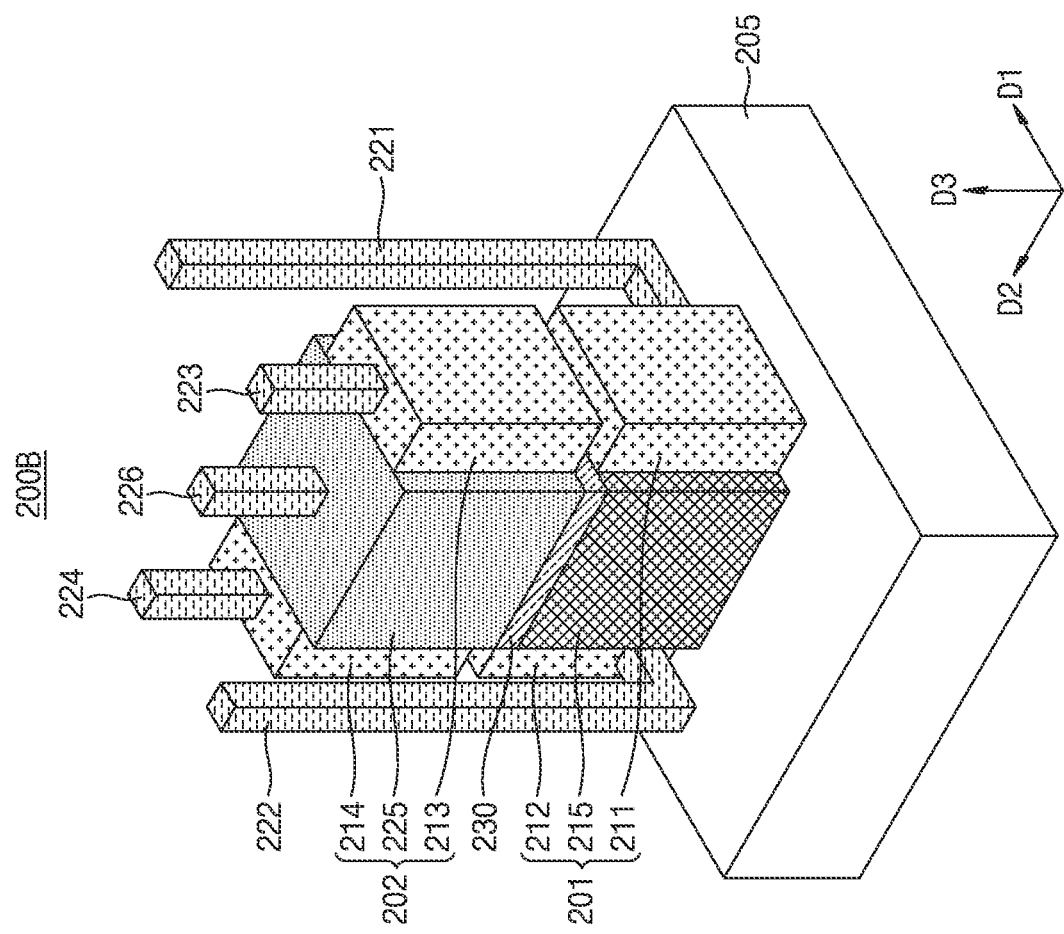
FIG. 2B illustrates a perspective view of a semiconductor device after source/drain regions are formed at the semiconductor device 200A of FIG. 2A.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of" when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices including nanosheet transistors may or may not be described in detail herein.

According to an embodiment, the nanosheet structure 100 shown in FIG. 1 can also be stacked vertically to constitute a multi-stack nanosheet structure to achieve an increased device density gain.

Figure 2A:
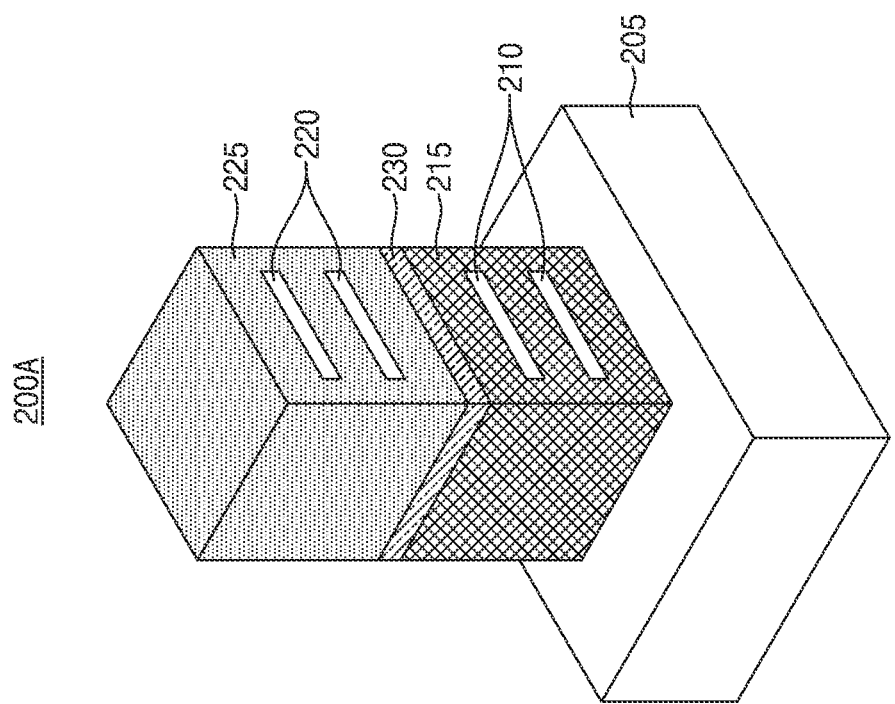
FIG. 2A illustrates a perspective view of a semiconductor device formed of a plurality of nanosheet layers, according to an embodiment.

FIG. 2A illustrates a perspective view of a semiconductor device formed of a plurality of nanosheet layers, according to an embodiment.

A semiconductor device 200A shown in FIG. 2A is in a state before the semiconductor device 200A is formed as two nanosheet transistors. The semiconductor device 200A has a $1^{st}$ channel set of a plurality of $1^{st}$ nanosheet layers 210 and a $2^{nd}$ channel set of a plurality of $2^{nd}$ nanosheet layers 220. The $1^{st}$ and $2^{nd}$ channel sets are stacked above a substrate 205 in a vertically overlapping manner in the D3 direction to constitute a multi-stack nanosheet structure. An isolation layer 230 is interposed between the $1^{st}$ and $2^{nd}$ channel sets.

FIG. 2A also shows that $1^{st}$ and $2^{nd}$ gate structures 215 and 225 completely surround channel regions (not seen) of the $1^{st}$ and $2^{nd}$ nanosheet layers 210 and 220, respectively, except their open ends at two opposite sides of the $1^{st}$ and $2^{nd}$ gate structures 215 and 225 where source/drain regions may be epitaxially grown to constitute two nanosheet transistors as shown in FIG. 2B. Thus, the $1^{st}$ and $2^{nd}$ nanosheet layers 210 and 220 take a form of penetrating the gate structures 215 and 225 in the D2 direction, which is a channel length direction.

FIG. 2B illustrates a perspective view of a semiconductor device after source/drain regions are formed at the semiconductor device 200A of FIG. 2A.

Referring to FIG. 2B, a semiconductor device 200B includes a lower transistor 201 having $1^{st}$ and $2^{nd}$ source/drain regions 211 and 212 at both ends of channel regions (not seen) of the $1^{st}$ nanosheet layers 210, and an upper transistor 202 having $3^{rd}$ and $4^{th}$ source/drain regions 213 and 214 at both ends of the channel regions (not seen) of the $2^{nd}$ nanosheet layers 220. These source/drain regions 211 to 214 will be respectively connected to power sources or other circuit elements (not shown) for internal routing through $1^{st}$ to $4^{th}$ source/drain contact structures 221 to 224. Further, the $2^{nd}$ gate structure 225 is configured to receive a gate input signal through a gate contact structure 226.

However, it is noted that because the $3^{rd}$ and $4^{th}$ source/drain regions 213 and 214 of the upper transistor 202 vertically overlap the $1^{st}$ and $2^{nd}$ source/drain regions 211 and 212 of the lower transistor 201, respectively, the $1^{st}$ and $2^{nd}$ source/drain contact structures 221 and 222 extended straight downward from upper metal patterns (not shown) are bent to make respective lateral contacts with the side surfaces of the $1^{st}$ and $2^{nd}$ source/drain regions 211 and 212 of the lower transistor 201, according to an embodiment. Otherwise, the $1^{st}$ and $2^{nd}$ source/drain contact structures 221 and 222 can be connected from below, in which case corresponding lower metal patterns connected to the $1^{st}$ and $2^{nd}$ source/drain contact structures 221 and 222 may be buried in the substrate 205, according to an embodiment.

However, it is very difficult to implement the aforementioned lateral connection to a source/drain region with a bent-shaped source/drain contact structure and the upward connection using a substrate-buried metal pattern during a manufacturing process of a nanosheet-based semiconductor device.

Thus, according to an embodiment, a new structure of a semiconductor device formed of a plurality of nanosheet layers and a method of manufacturing the same are provided as following.

Figure 3A:
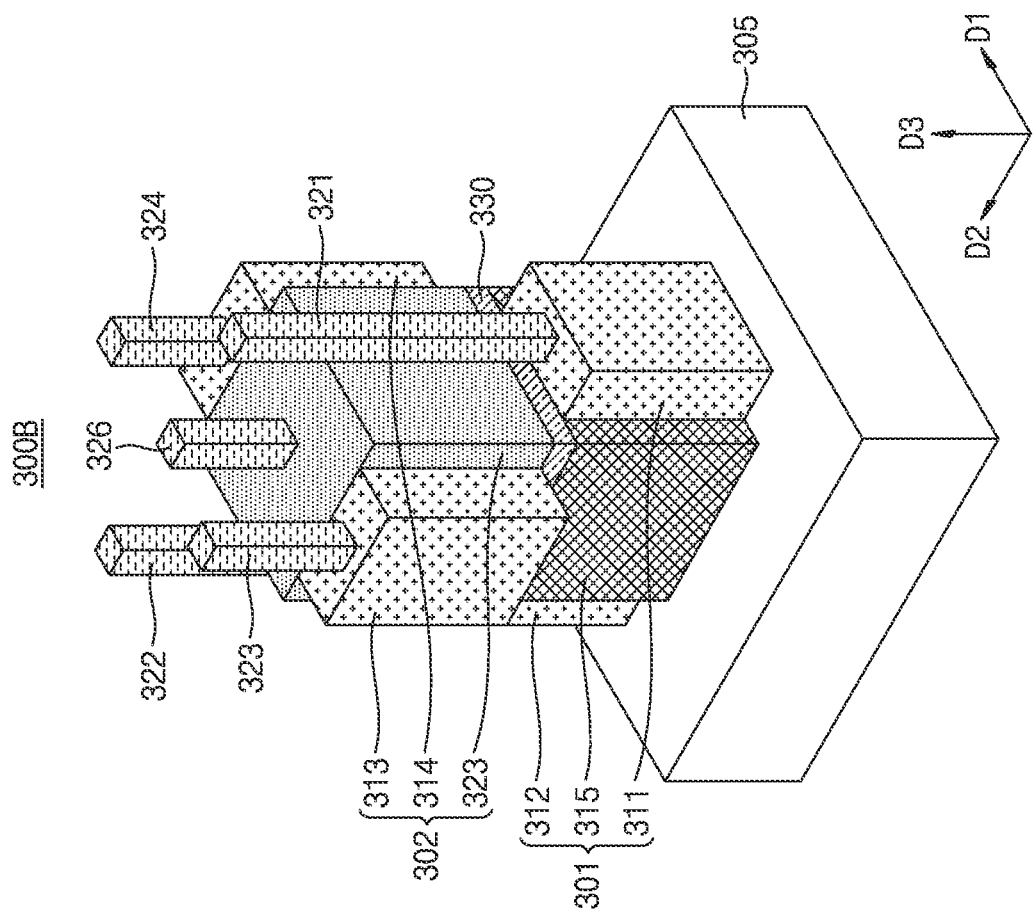
FIG. 3A illustrates a perspective view of a semiconductor device formed of a plurality of nanosheet layers according to an embodiment.

FIG. 3A illustrates a perspective view of a semiconductor device formed of a crossing multi-stack nanosheet structure according to an embodiment.

A semiconductor device 300A shown in FIG. 3A according to an embodiment is in a state before the semiconductor device 300A is formed as two nanosheet transistors, like the semiconductor device 200A of FIG. 2A. Similar to the semiconductor device 200A of FIG. 2A, the semiconductor device 300A shown in FIG. 3A has a $1^{st}$ channel set of a plurality of $1^{st}$ nanosheet layers 310 and a $2^{nd}$ channel set of a plurality of $2^{nd}$ nanosheet layers 320. The $1^{st}$ and $2^{nd}$ channel sets are stacked above a substrate 305 in a vertically overlapping manner in the D3 direction to constitute a multi-stack nanosheet structure. An isolation layer 330 is interposed between the $1^{st}$ and $2^{nd}$ channel sets.

Figure 3B:
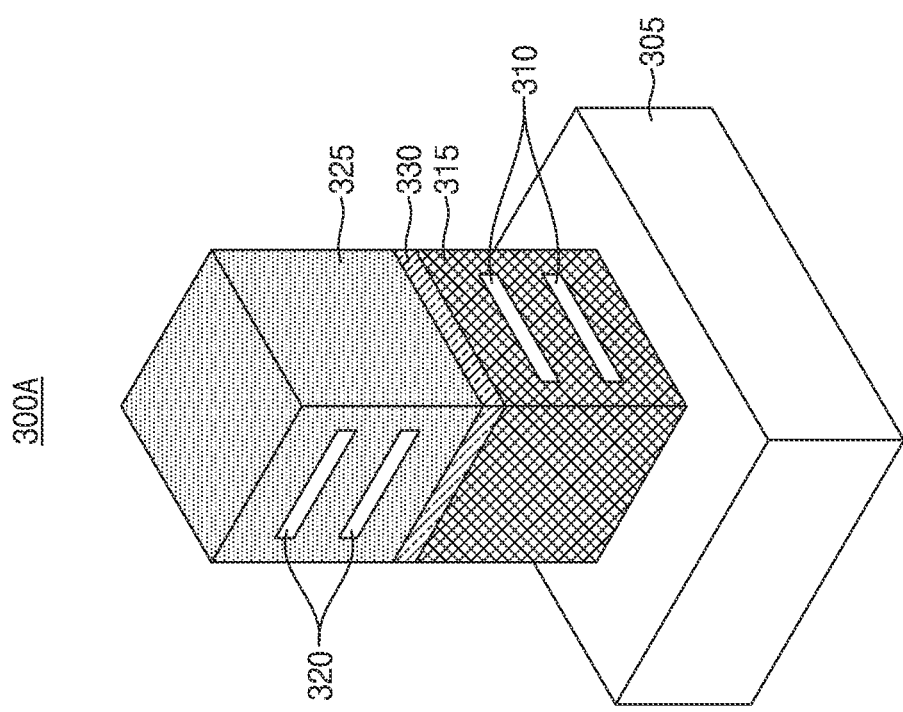
FIG. 3B illustrates a semiconductor device after source/drain regions are formed on the semiconductor device 300A of FIG. 3A.

Further, $1^{st}$ and $2^{nd}$ gate structures 315 and 325 completely surround channel regions (not seen) of the $1^{st}$ and $2^{nd}$ nanosheet layers, respectively, except their open ends at two opposite sides of the $1^{st}$ and $2^{nd}$ gate structures 315 and 325 where source/drain regions may be epitaxially grown to constitute two nanosheet transistors as shown in FIG. 3B.

However, the semiconductor device 300A is different from the semiconductor device 200A in that the $2^{nd}$ nanosheet layers 320 are extended in the D1 direction while the $1^{st}$ nanosheet layers 310 structure extended in the D2 direction. That is, the channel length direction and the channel width direction of the $1^{st}$ nanosheet layers are at an angle, such as perpendicular, to the channel length direction and the channel width direction of the $2^{nd}$ nanosheet layers, respectively. This structural difference of the semiconductor device 300A from the semiconductor device 200A is intended so that source/drain regions formed from the $2^{nd}$ nanosheet layers 320 do not vertically overlap source/drain regions formed from the $1^{st}$ nanosheet layers 310 as described below in reference to FIG. 3B.

FIG. 3B illustrates a semiconductor device after source/drain regions are formed on the semiconductor device 300A of FIG. 3A.

Referring to FIG. 3B, a semiconductor device 300B according to an embodiment includes a lower transistor 301 having $1^{st}$ and $2^{nd}$ source/drain regions 311 and 312 at both ends of its channel regions (not seen) of the $1^{st}$ nanosheet layers 310, and an upper transistor 302 having $3^{rd}$ and $4^{th}$ source/drain regions 313 and 314 at both ends of channel regions (not seen) of the $2^{nd}$ nanosheet layers 320. These source/drain regions 311 to 314 will be respectively connected to power sources or other circuit elements (not shown) for internal routing through $1^{st}$ to $4^{th}$ source/drain contact structures 321 to 324. Further, the $2^{nd}$ gate structure 325 is configured to receive a gate input signal through a gate contact structure 326.

The above-described structural aspects of the semiconductor device 300B are similar to those of the semiconductor device 200B of FIG. 2B except that the $3^{rd}$ and $4^{th}$ source/drain regions formed on channel ends of the $2^{nd}$ nanosheet layers do not vertically overlap the $1^{st}$ and $2^{nd}$ source/drain regions formed on channel ends of the $1^{st}$ nanosheet layers. Thus, the semiconductor device 300B, unlike the semiconductor device 200B of FIG. 2B, does not require $1^{st}$ and $2^{nd}$ source/drain contact structures 321 and 322 extended straight downward from upper metal patterns (not shown) to be bent to make respective lateral contacts with the side surfaces of the $1^{st}$ and $2^{nd}$ source/drain regions 311 and 312 of the lower transistor 301, respectively. Thus, the $1^{st}$ and $2^{nd}$ source/drain contact structures can be configured to land on top surfaces of the $1^{st}$ and $2^{nd}$ source/drain regions without being bent like in the semiconductor device 200B of FIG. 2B.

The above structural characteristics of the semiconductor device 300 enables far simpler formation of source/drain contact structures compared to the related art semiconductor device. In addition, as the distance between the $3^{rd}$ or $4^{th}$ source/drain region 313 or 314 and the $1^{st}$ or $2^{nd}$ source/drain contact structure 321 or 322 in the semiconductor device 300B of FIG. 3B becomes greater, it is possible to reduce a parasitic capacitance that may occur between the $3^{rd}$ or $4^{th}$ source/drain region 313 or 314 and the $1^{st}$ or $2^{nd}$ source/drain contact structure 321 or 322, compared to the structure of the semiconductor device 200B of FIG. 2B.

In the semiconductor device 300B, the lower transistor 301 may be one of a p-type MOSFET and an n-type MOSFET, while the upper transistor 302 may be the other of the p-type MOSFET and the n-type MOSFET, in which case the $1^{st}$ and $2^{nd}$ source/drain regions may be differently doped from the $3^{rd}$ and $4^{th}$ source/drain regions, and the $1^{st}$ gate structure 315 may have a different work function material or characteristic from the $2^{nd}$ gate structure 325.

Herebelow, a method of manufacturing a semiconductor device having a structure corresponding to the structure of the above-described semiconductor device 300B is described.

FIGS. 4A-4C through 12A-12C illustrate a method of manufacturing a semiconductor device having a multi-stack nanosheet structure, according to embodiments. In the drawings, the reference numbers indicating the same elements in different drawings may be omitted in one or more of the drawings for brevity.

Figure 4C:
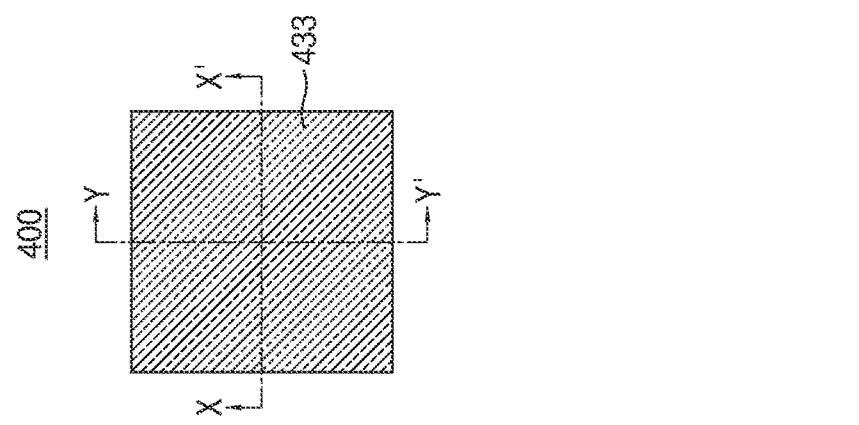
FIGS. 4A to 4C illustrate two cross-sectional views and a plan view of a semiconductor device, respectively, in a state where a plurality of nanosheet stacks are formed on a substrate, according to an embodiment.
Figure 4B:
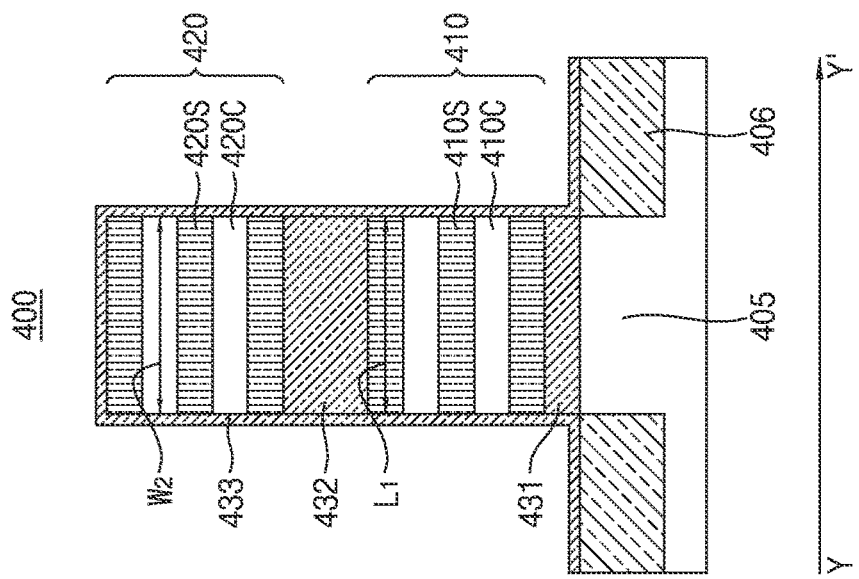
Figure 4A:
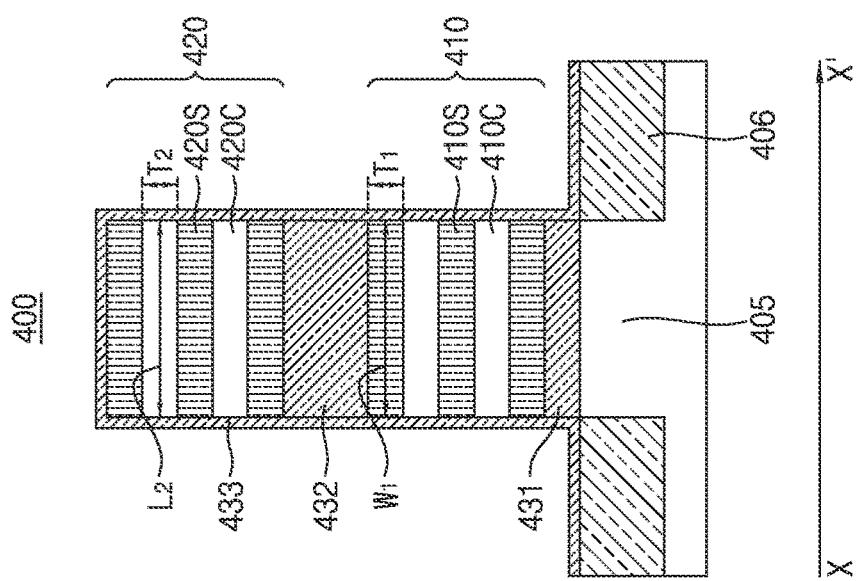

FIGS. 4A to 4C illustrate two cross-sectional views and a plan view of a semiconductor device, respectively, in a state where a plurality of nanosheet stacks are formed on a substrate, according to an embodiment.

FIG. 4A is a cross-sectional view of a semiconductor device 400 taken along a line X-X' in FIG. 4C which is a top plan view of the semiconductor device 400, and FIG. 4A is a cross-sectional view of a semiconductor device 400 taken along a line Y-Y' in FIG. 4C. It is noted here that the scale used to show the semiconductor device 400 used in FIGS. 4A and 4B is not the same as that used in FIG. 4C. This scale difference applies to all of the other drawings referred to herebelow.

Referring to FIGS. 4A-4C, a $1^{st}$ nanosheet stack 410 and a $2^{nd}$ nanosheet stack 420 are sequentially stacked on a substrate 405 with $1^{st}$ and $2^{nd}$ isolation layers 431 and 432 therebetween, respectively, and entirely enclosed by a $3^{rd}$ isolation layer 433, according to an embodiment. The $1^{st}$ nanosheet stack 410 includes three $1^{st}$ sacrificial layers 410S and two $1^{st}$ nanosheet layers 410C formed alternatingly above the substrate 305, and the $2^{nd}$ nanosheet stack 420 includes three $2^{nd}$ sacrificial layers 420S and two $2^{nd}$ nanosheet layers 410C formed alternatingly above the $1^{st}$ nanosheet stack 410.

Although FIGS. 4A and 4B show that the $1^{st}$ and $2^{nd}$ nanosheet stacks 410 and 420 each have only two nanosheet layers and three sacrificial layers, the number of the nanosheet layers and the sacrificial layers in each nanosheet stack is not limited thereto. According to an embodiment, the $1^{st}$ sacrificial layers 410S and the $1^{st}$ nanosheet layers 410C may be formed by epitaxially growing one layer and then another until a desired number of the sacrificial layers and the nanosheet layers are alternatingly stacked. In the same manner as the $1^{st}$ nanosheet stack 410, the $2^{nd}$ sacrificial layers 420S and the $2^{nd}$ nanosheet layers 420C may be formed to build the $2^{nd}$ nanosheet stack 420. According to an embodiment, the number of nanosheet layers and the number of sacrificial layers of the $1^{st}$ nanosheet stack 410 may differ from those of the $2^{nd}$ nanosheet stack 420.

According to an embodiment, the $1^{st}$ isolation layer 431 may be epitaxially grown from the substrate 405 before the $1^{st}$ nanosheet stack 410 is formed on the substrate 305 to isolate the $1^{st}$ nanosheet stack 410 from the substrate 405. After the $1^{st}$ nanosheet stack 410 is formed, the $2^{nd}$ isolation layer 432 may be formed to separate the $1^{st}$ nanosheet stack 410 from the $2^{nd}$ nanosheet stack 420 to be formed thereafter. After the $2^{nd}$ nanosheet stack 420 is formed on the $2^{nd}$ isolation layer 432, the $3^{rd}$ isolation layer 433 is formed to entirely enclose the $1^{st}$ and $2^{nd}$ nanosheet stacks 410 and 420 above the substrate 405.

On the substrate 405, shallow trench isolation (STI) regions 406 are formed to isolate the semiconductor device 400 from neighboring circuit elements or semiconductor devices.

According to an embodiment, each of the $1^{st}$ nanosheet layers 410C of the $1^{st}$ nanosheet stack 410 may have a same length L1 in a X direction, a same width W1 in a Y direction, and a same thickness T1 in a Z direction, and each of the $2^{nd}$ nanosheet layers 420C of the $2^{nd}$ nanosheet stack 420 may have a same length L2 in the Y direction, the same width W2 in the X direction, and the same thickness T2 in the Z direction. Further, according to an embodiment, the length L1, the width W1, the length L2, and the width W2 may be equal to one another. Thus, the $1^{st}$ and $2^{nd}$ nanosheet stacks 410 and 420 may have a same square shape in a plan view (not shown). However, these dimensions may differ between the $1^{st}$ nanosheet layers 410C and between the $2^{nd}$ nanosheet layers 420C, and between the $1^{st}$ nanosheet stack 410 and the $2^{nd}$ nanosheet stack 420, according to embodiments. For example, the length L1 may not equal to the width W1 but may be equal to the length L2, and thus, the $1^{st}$ and $2^{nd}$ nanosheet stacks 410 and 420 may have a same rectangular shape. Still, however, the channel length direction and the channel width direction of the $1^{st}$ nanosheet layers 410C may be different from the channel length direction and the channel width direction of the $2^{nd}$ nanosheet layers 420C, according to an embodiment.

The substrate 405 may be formed of silicon (Si), the STI regions 406 may be formed of silicon oxide ($SiO_x$), the $1^{st}$ to $3^{rd}$ isolation layers 431 to 433 may also be formed of $SiO_x$ the same as or different from the STI region 406, the $1^{st}$ and $2^{nd}$ sacrificial layers 410S and 420S may be formed of silicon-germanium (SiGe), and the $1^{st}$ and $2^{nd}$ nanosheet layers 410C and 420C may be formed of Si. The $1^{st}$ and $2^{nd}$ sacrificial layers 410S and 420S may be SiGe 35%, which indicates that the SiGe compound consists of 35% of Ge and 65% of Si, according to an embodiment.

Figure 5C:
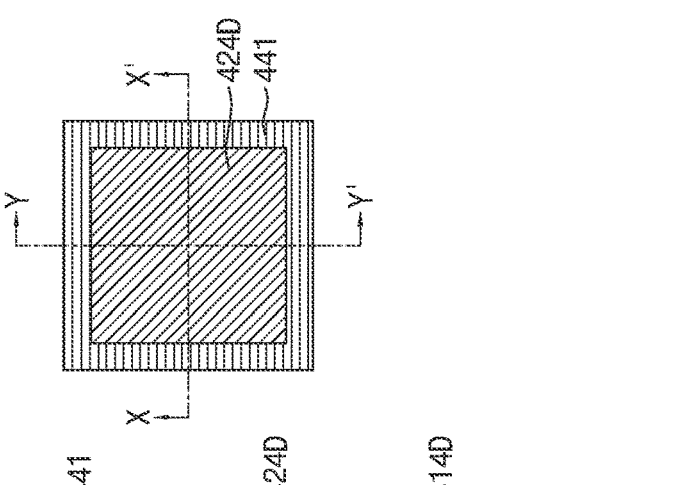
FIGS. 5A to 5C illustrate two cross-sectional views and a plan view of a semiconductor device, respectively, with dummy gates formed thereon, according to an embodiment.
Figure 5B:
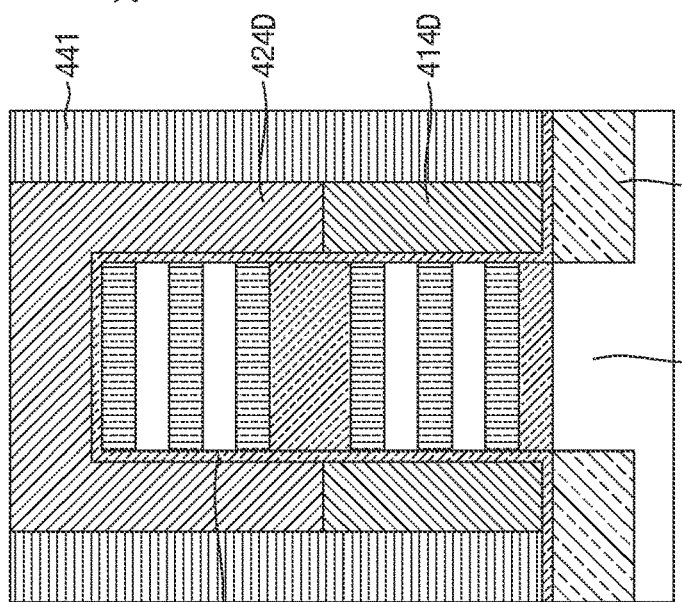
Figure 5A:
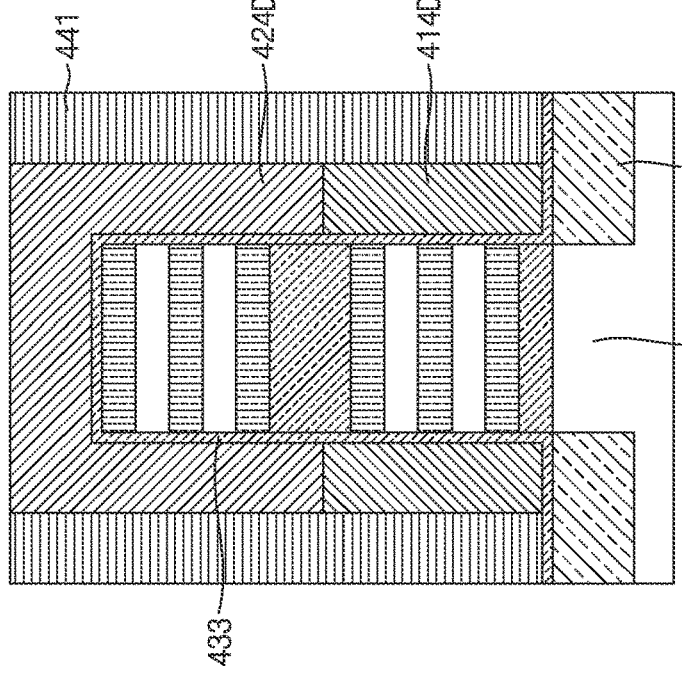

FIGS. 5A to 5C illustrate two cross-sectional views and a plan view of a semiconductor device, respectively, with dummy gates formed thereon, according to an embodiment.

FIG. 5A is a cross-sectional view of a semiconductor device 500 taken along a line X-X' in FIG. 5C which is a top plan view of the semiconductor device 500, and FIG. 5B is a cross-sectional view of a semiconductor device 500 taken along a line Y-Y' in FIG. 5C.

Referring to FIGS. 5A to 5C, $1^{st}$ and $2^{nd}$ dummy gates 414D and 424D, and an interlayer dielectric (ILD) layer 441 are formed on the semiconductor device 400 of FIGS. 4A to 4C. The $1^{st}$ and $2^{nd}$ dummy gates 414D and 424D are termed as such because they are to be replaced with real gate structures in a later step.

The $1^{st}$ dummy gate 414D is formed, for example, by lithography and etching, on the $1^{st}$ nanosheet stack 410 to cover all side flanks of the $1^{st}$ nanosheet stack 410 formed below the $2^{nd}$ nanosheet stack 420. Specifically, the $1^{st}$ dummy gate 414D encloses the $3^{rd}$ isolation layer 433 formed on all side surfaces of the $1^{st}$ nanosheet stack 410. Next, the $2^{nd}$ dummy gate 424 is formed on the $1^{st}$ dummy gate 414D, for example, also by lithography and etching, to cover not only all side flanks but also a top of the $2^{nd}$ nanosheet stack 420. Specifically, the $2^{nd}$ dummy gate 424 encloses the $3^{rd}$ isolation layer 433 formed on all side surfaces and top surface of the $2^{nd}$ nanosheet structure 410.

The $1^{st}$ dummy gate 414D may include amorphous silicon (a-Si) or polycrystalline silicon (poly-Si), and the $2^{nd}$ dummy gate 424 may include the same or different a-SI or poly-Si.

Once the $1^{st}$ and $2^{nd}$ dummy gates 414D and 424D are formed as described above, the ILD layer 441 is formed to enclose all side surfaces of the $1^{st}$ and $2^{nd}$ dummy gates. The ILD layer 441 may be formed by depositing an oxide material in bulk (e.g., silicon dioxide having a low-k dielectric). According to an embodiment, the ILD layer 441 may be formed before the $1^{st}$ and $2^{nd}$ dummy gates 414D and 424D are formed.

After the $1^{st}$ and $2^{nd}$ dummy gates 414D, 424D and the ILD layer 441 are formed as described above, the $1^{st}$ and $2^{nd}$ dummy gates 414D, 424D and the ILD layer 441 are planarized at their top surfaces, for example, by a chemical mechanical polishing (CMP) process.

Like FIGS. 4A and 4B, FIGS. 5A and 5B show the same structure of the semiconductor device 500 because its X-direction cross section has the same structural dimensions as its Y-direction cross section.

FIGS. 6A to 6C illustrate two cross-sectional views and a plan view of a semiconductor device, respectively, in which parts of a dummy gate enclosing an upper nanosheet stack are patterned, according to an embodiment.

FIG. 6A is a cross-sectional view of a semiconductor device 600 taken along a line X-X' in FIG. 6C which is a top plan view of the semiconductor device 600, and FIG. 6A is a cross-sectional view of a semiconductor device 600 taken along a line Y-Y' in FIG. 6C.

Referring to FIGS. 6A to 6C, the $2^{nd}$ dummy gate 424D, the ILD layer 441 and the $3^{rd}$ isolation layer 433 are partially patterned, for example, by dry etching, at each of the four sides of the $2^{nd}$ nanosheet stack from top, for example, by dry etching.

This patterning operation is performed from top to bottom to reach a level of a top surface of the uppermost $1^{st}$ sacrificial layer 410S of the $1^{st}$ nanosheet stack 410. In order to facilitate this patterning, an etch stop layer (not shown) may have been layered in the ILD layer 441, the $1^{st}$ dummy gate 414D, and the $3^{rd}$ isolation layer 433 at the level of the top surface on the uppermost $1^{st}$ sacrificial layer 410S in the step shown in FIGS. 5A to 5C, according to an embodiment. By this patterning operation, all four sides of the $2^{nd}$ nanosheet stack are exposed, and the $1^{st}$ dummy gate 414D, the ILD layer 441 and the $3^{rd}$ isolation layer 433 enclosing four sides of the $1^{st}$ nanosheet stack are exposed upward before a top channel passivation layer 451 is formed on the exposed four sides of the $2^{nd}$ nanosheet stack 420 and the exposed the $3^{rd}$ isolation layer 433.

According to an embodiment, this patterning operation may be performed by forming a mask layer (not shown) above the $2^{nd}$ dummy gate 424 corresponding to $1^{st}$ to $5^{th}$ sections 424-1 to 424-5 of the dummy gate 424 as shown in FIG. 6C. According to an embodiment, the $5^{th}$ section 424-5 of the dummy gate 424 may have a square or rectangular shape having a horizontal length of which is the same as the width of the $2^{nd}$ nanosheet layers and the length of the $2^{nd}$ nanosheet layer. Further, the $1^{st}$ to $4^{th}$ sections 424-1 to 424-4 may take a shape of four protrusions from four edges of the $5^{th}$ section 424-5 as shown in the top plan view of the semiconductor device 600 in FIG. 6C.

It is noted here that the $1^{st}$ to $4^{th}$ sections 424-1 to 424-4 are patterned around the $5^{th}$ section 424-5, which is a main body section, in the $2^{nd}$ dummy gate 424 to obtain a hole or trench (hereafter "hole") penetrating into at least one of the $1^{st}$ to $4^{th}$ sections 424-1 to 424-4 through which at least the $1^{st}$ dummy gate 414D and the $1^{st}$ sacrificial layer 410S of the $1^{st}$ nanosheet stack 410 are removed, and a replacement metal gate (RMG) to surround the $1^{st}$ nanosheet layers of the $1^{st}$ nanosheet stack 410 crossing the $2^{nd}$ nanosheet layers of the $2^{nd}$ nanosheet stack 420 can be deposited at a later step. Although FIG. 6C shows that the $1^{st}$ to $4^{th}$ sections 424-1 to 424-4 are formed by the above-described patterning, only one, two or three sections of the $1^{st}$ to $4^{th}$ sections 424-1 to 424-4 may be patterned to serve the aforementioned purposes. Further, the sizes of the $1^{st}$ to $4^{th}$ sections 424-1 to 424-4 with respect to that of the $5^{th}$ section 424-5 shown in FIG. 5C are not to exact scale. Further, according to embodiments, the $1^{st}$ to $4^{th}$ sections 424-1 to 424-4 may have different sizes from one another.

Next, the top channel passivation layer 451 is formed on the exposed four sides of the $2^{nd}$ nanosheet stack 320 and the exposed $3^{rd}$ isolation layer 433 from the above-described patterning. The top channel passivation layer 451 is formed to protect the $2^{nd}$ nanosheet layers 420C of the $2^{nd}$ nanosheet stack 420 when source/drain regions are epitaxially grown on the $1^{st}$ nanosheet layers 410C of the $1^{st}$ nanosheet stack 410 in a later step. The top channel passivation layer 451 at two sides of the $2^{nd}$ nanosheet stack as shown in FIG. 6B along with the $5^{th}$ section 424-5 of the $2^{nd}$ dummy gate 424 are to be used as a mask to remove the $1^{st}$ dummy gate 414D, the ILD layer 441 and the $3^{rd}$ isolation layer 433 at two sides of the $1^{st}$ nanosheet stack where source/drain regions are to be epitaxially grown in the next step.

Figure 7A:
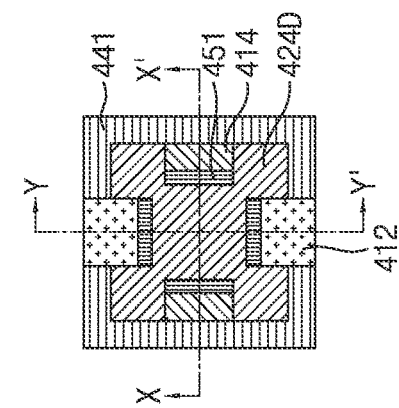
FIGS. 7A to 7C illustrate two cross-sectional views and a top plan view of a semiconductor device, respectively, in which source/drain regions are grown on a lower nanosheet stack, according to an embodiment.
Figure 7B:
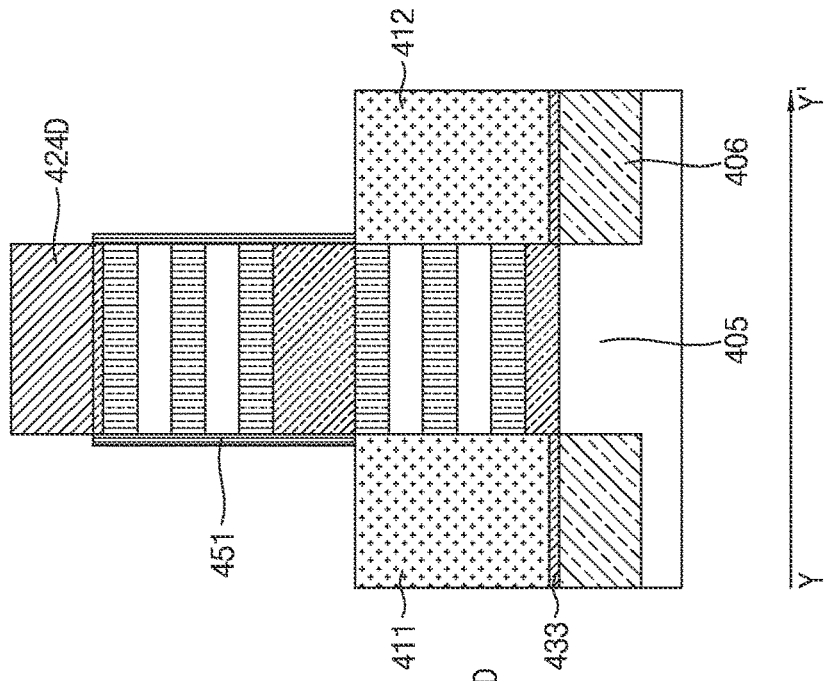
Figure 7C:
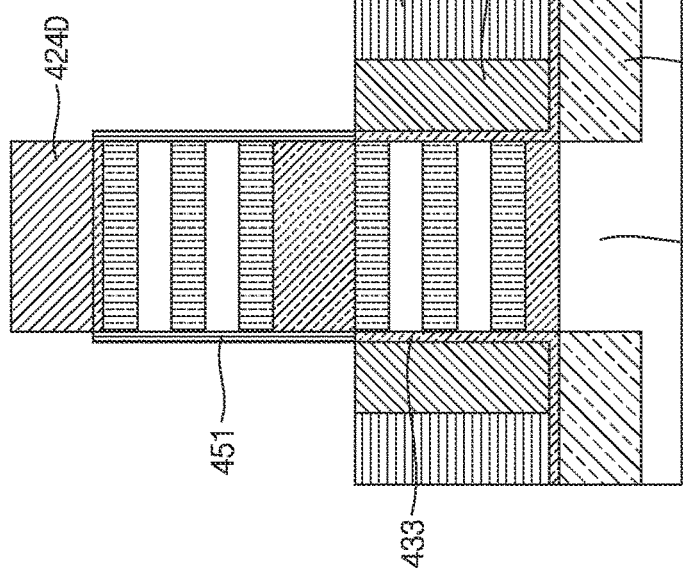

FIGS. 7A to 7C illustrate two cross-sectional views and a top plan view of a semiconductor device, respectively, in which source/drain regions are grown on a lower nanosheet stack, according to an embodiment.

FIG. 7A is a cross-sectional view of a semiconductor device 700 taken along a line X-X' in FIG. 7C which is a top plan view of the semiconductor device 700, and FIG. 7B is a cross-sectional view of a semiconductor device 700 taken along a line Y-Y' in FIG. 7C.

Referring to FIGS. 7A to 7C, the $1^{st}$ dummy gate 414D, the ILD layer 441 and the $3^{rd}$ isolation layer 433 enclosing the $1^{st}$ nanosheet stack are partially removed at two sides of the $1^{st}$ nanosheet stack 410 to expose two ends of the $1^{st}$ nanosheet stack 410 in the channel length direction, for example, by dry etching and/or wet etching, and then, source/drain regions 411 and 412 are formed at the two sides of the $1^{st}$ nanosheet stack 410, that is, two sides along the Y-Y' axis of FIG. 7B, but not along the sides of the X-X axis of FIG. 7A. These source/drain regions 411 and 412 correspond to the source/drain regions 311 and 312 of the lower transistor 301 shown in FIG. 3B. The source/drain region 411 and 412 may be formed through epitaxial growth process on the exposed two ends of the $1^{st}$ nanosheet stack 410, specifically, the $1^{st}$ nanosheet layers 410C, in the channel length direction. In-situ doping (ISD) may be applied to dope the source/drain regions 411 and 412.

FIGS. 8A to 8C illustrate two cross-sectional views and a top plan view of a semiconductor device, respectively, in which source/drain regions are grown on an upper nanosheet stack, according to an embodiment.

FIG. 8A is a cross-sectional view of a semiconductor device 800 taken along a line X-X' in FIG. 8C which is a top plan view of the semiconductor device 800, and FIG. 8B is a cross-sectional view of a semiconductor device 800 taken along a line Y-Y' in FIG. 8C.

Referring to FIGS. 8A to 8C, the top channel passivation layer 451 formed at both ends of the $2^{nd}$ nanosheet stack 420 in its channel length direction and the $3^{rd}$ isolation layer 433 therebelow are removed along the X-X' direction in FIG. 8A, for example, by dry etching, and a $4^{th}$ isolation layer 434 is formed on the exposed ILD layer 441 and the $1^{st}$ dummy gate 414D at both ends of the $1^{st}$ nanosheet stack in its channel length direction. The $4^{th}$ isolation layer 434 may be formed of SiO, SiN or its equivalents to further isolate the $1^{st}$ and $2^{nd}$ source/drain regions 411 and 412 from $3^{rd}$ and $4^{th}$ source/drain regions 413 and 414 to be formed. The thickness of this $4^{th}$ isolation layer 434 may be the same as the $2^{nd}$ isolation layer 432.

Next, the $3^{rd}$ and $4^{th}$ source/drain regions 413 and 414 are formed on the $4^{th}$ isolation layer 434 at both ends of the $2^{nd}$ nanosheet stack 420 in its channel length direction along the X-X' direction as shown in FIGS. 8A and 8C in the same manner as the $1^{st}$ and $2^{nd}$ source/drain regions 411 and 412 are formed in the previous step.

Figure 9C:
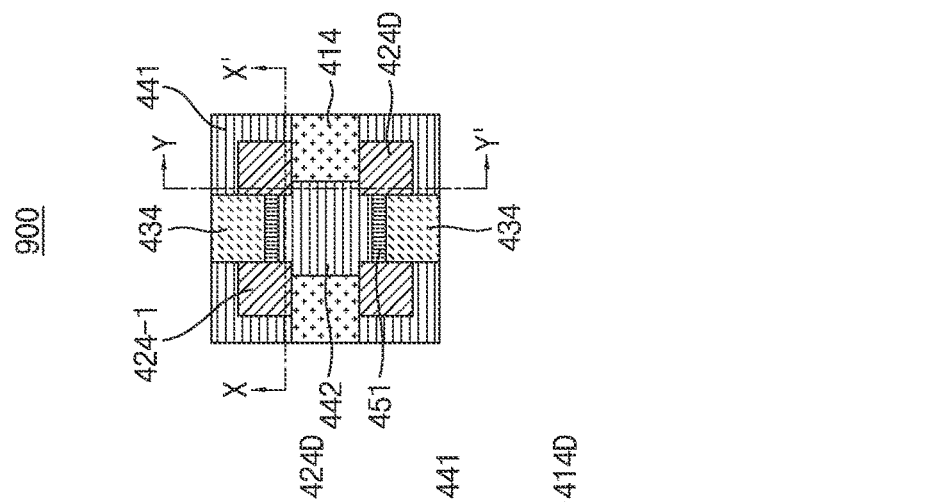
FIGS. 9A to 9C illustrate two cross-sectional views and a top plan view of a semiconductor device, respectively, in which an additional ILD layer is formed above an upper nanosheet stack, according to an embodiment.
Figure 9B:
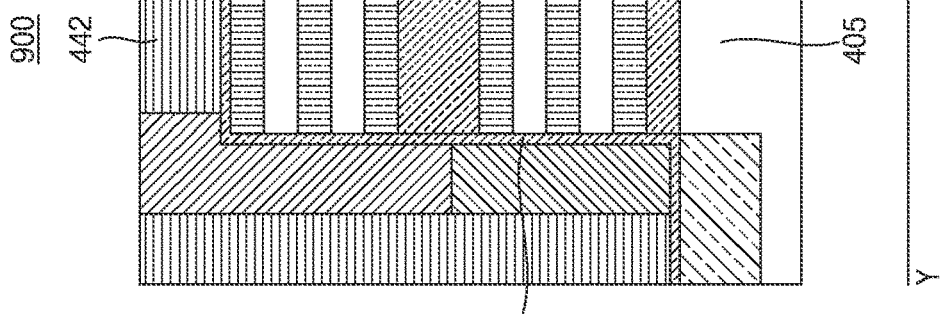
Figure 9A:
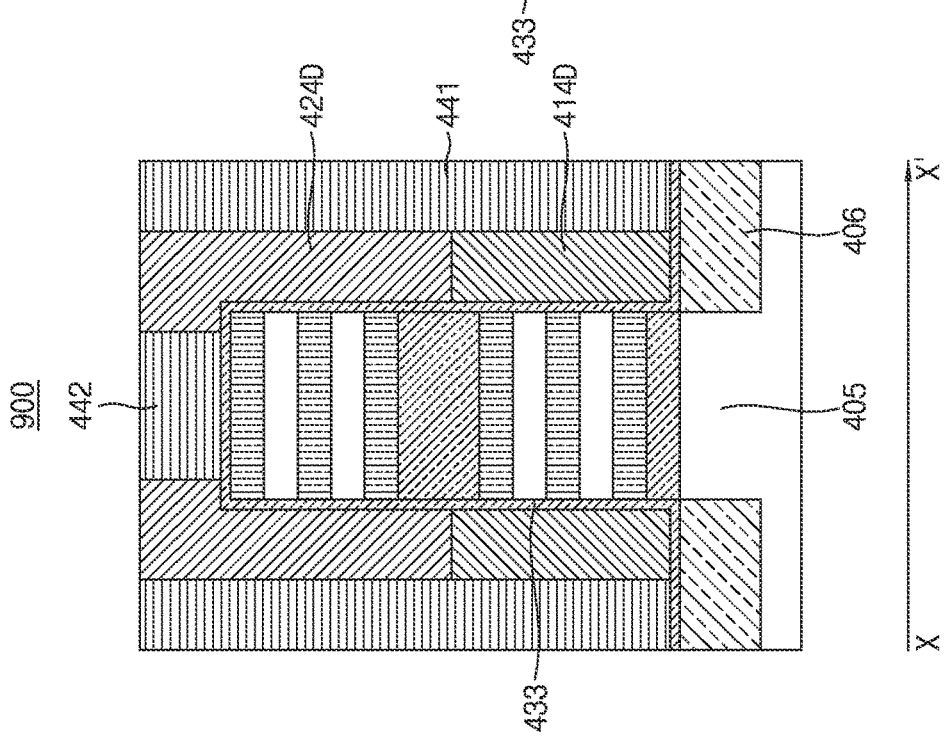

FIGS. 9A to 9C illustrate two cross-sectional views and a top plan view of a semiconductor device, respectively, in which an additional ILD layer is formed above an upper nanosheet stack, according to an embodiment.

FIG. 9A is a cross-sectional view of a semiconductor device 900 taken along a line X-X' in FIG. 9C which is a top plan view of the semiconductor device 900, and FIG. 9B is a cross-sectional view of a semiconductor device 900 taken along a line Y-Y' in FIG. 9C. It is noted here that the lines X-X' and Y-Y' shown in FIG. 9C are not center lines of the semiconductor device 900 in the top plan view as the lines X-X' and Y-Y' shown in FIGS. 4C to 8C are. In FIG. 9C, the lines X-X' and Y-Y' are drawn to show cross sections of the $1^{st}$ section 424-1, the $2^{nd}$ section 424-2 and the $4^{th}$ section 424-4 of the $2^{nd}$ dummy gate 424 and abutting elements.

Referring to FIGS. 9A to 9C, the cross sections at the lines X-X' and Y-Y' still show the $3^{rd}$ isolation layer 433, the $1^{st}$ and $2^{nd}$ dummy gates 414D, 424D and the ILD layer 441 enclosing these two dummy gates, similarly to the semiconductor device 500 shown in FIGS. 5A and 5B. However, the $2^{nd}$ dummy gate 424 above the $2^{nd}$ nanosheet stack 420, specifically, above the $3^{rd}$ isolation layer 433 on the $2^{nd}$ nanosheet stack 420, is partially removed, and an additional ILD layer 442 is filled therein instead. Next, the top portion of the additional ILD layer 442 is planarized, for example, by CMP, to be coplanar with the top surfaces of the existing ILD layer 441 and the $2^{nd}$ dummy gate 424.

FIGS. 10A to 10C illustrate two cross-sectional views and a top plan view of a semiconductor device, respectively, in which a replacement metal gate is formed to surround nanosheet layers of a lower nanosheet stack, according to an embodiment.

FIG. 10A is a cross-sectional view of a semiconductor device 1000 taken along a line X-X' in FIG. 10C which is a top plan view of the semiconductor device 1000, and FIG. 10B is a cross-sectional view of a semiconductor device 1000 taken along a line Y-Y' in FIG. 10C. It is noted here that the lines X-X' and Y-Y' shown in FIG. 10C are drawn at the same positions at the lines X-X' and Y-Y' shown in FIG. 9C.

Referring to FIGS. 10A to 10C, the $1^{st}$ section 424-1 is partially removed downward from top in order to form a hole 415H reaching the $1^{st}$ dummy gate 414D. Then, through this hole 415H, the $1^{st}$ dummy gate 414D and the $1^{st}$ sacrificial layers 410S of the $1^{st}$ nanosheet stack 410 are removed in their entirety. At this time, the $3^{rd}$ isolation layer 433 at the side of the $1^{st}$ nanosheet stack 410 is also removed. Next, the space including the hole 415H void from this removal operation is filled in with a $1^{st}$ replacement metal gate 415. This removal operation may be performed by dry etching, wet etching, reactive ion etching (RIE) and/or a chemical oxide removal (COR) process. When the $1^{st}$ replacement metal gate 415 is filled in the void space, a hafnium (Hf) based high-k dielectric layer and a work function metal layer of Titanium (Ti), Tantalum (Ta) or their compound may be first deposited, and then, a conductor metal such as tungsten (W) or aluminum (Al) may be deposited to form the $1^{st}$ replacement metal gate 415 surrounding the $1^{st}$ nanosheet layers.

It is noted here that, as shown in FIGS. 10A and 10C, the hole 415H formed in the $2^{nd}$ dummy gate 424 used for the above removal operation may be filled with the $1^{st}$ replacement metal gate 415 so that this part 415-1 of the $1^{st}$ replacement metal gate 415 may be used for connection with a replacement metal gate to surround the $2^{nd}$ nanosheet layers in the next step.

Although FIGS. 10A and 10C show that only the $1^{st}$ section 424-1 of the second dummy gate 424 is partially removed to form the hole 415H for the above removal and filling operations, one or more of the $1^{st}$ to $4^{th}$ sections 424-1 to 424-4 may be used for the same purposes, according to embodiments. Thus, the $1^{st}$ replacement metal gate 415 may be partially formed by filling in one or more of holes or trenches formed at one or more of the $1^{st}$ to $4^{th}$ sections 424-1 to 424-4, according to embodiments.

FIGS. 11A to 11C illustrate two cross-sectional views and a top plan view of a semiconductor device, respectively, in which a replacement metal gate is formed to surround nanosheet layers of an upper nanosheet stack, according to an embodiment.

FIG. 11A is a cross-sectional view of a semiconductor device 1100 taken along a line X-X' in FIG. 11C which is a top plan view of the semiconductor device 1100, and FIG. 11B is a cross-sectional view of a semiconductor device 1100 taken along a line Y-Y' in FIG. 11C. It is noted here that the lines X-X' and Y-Y' shown in FIG. 11C are drawn at the same positions at the lines X-X' and Y-Y' shown in FIG. 9C and FIG. 10C.

Referring to FIGS. 11A to 11C, the $2^{nd}$ dummy gate 414D is now completely removed along with the $2^{nd}$ sacrificial layers 420S of the $2^{nd}$ nanosheet stack 420 and the remaining $3^{rd}$ isolation layer 433. Instead, a space generated from this removal operation is filled in with a $2^{nd}$ replacement metal gate 425. Similar to the operations performed in the previous step, this removal operation may be performed by the RIE or COR process, and the $2^{nd}$ replacement metal gate formation is performed by first depositing an Hf based high-k dielectric layer and a work function metal layer of Ti, Ta or their compound followed by depositing a conductor metal such as tungsten (W) or aluminum (Al). It is noted here that the $1^{st}$ replacement metal gate 415 and the $2^{nd}$ replacement metal gate 425 gate may be insulated from each other by another isolation layer (not shown) including, for example, a high-k dielectric material.

FIGS. 11A and 11B shows that the $1^{st}$ and $2^{nd}$ dummy gates 414D and 424D including the remaining $1^{st}$ to $4^{th}$ sections 424-1 to 424-4 of the $2^{nd}$ dummy gate 424 shown in FIGS. 10A to 10C are removed in their entirety and replaced with the $2^{nd}$ replacement metal gate 425 in the semiconductor device 1100. Thus, the semiconductor device 1100 now has the $1^{st}$ and $2^{nd}$ replacement metal gates 415 and 425 at not only a section corresponding to the $5^{th}$ section 424-5 but also four sections corresponding to the $1^{st}$ to $4^{th}$ sections 424-1 to 424-4. It is noted here that the section corresponding to the section 424-1 now includes the part 415-1 of the $1^{st}$ replacement metal gate 415 as well as a part of the $2^{nd}$ replacement metal gate 425 side by side as shown in FIG. 11A. According to embodiments, however, one or more of the sections corresponding to the $1^{st}$ to $4^{th}$ sections 424-1 to 424-4 may be formed to include a part of the $1^{st}$ replacement metal gate 415 as well as a part of the $2^{nd}$ replacement metal gate 425. This structure of the semiconductor device 110 is different from that of the semiconductor device 300B shown in FIG. 3B.

Next, top portions of the $2^{nd}$ replacement metal gate 425 at the sections corresponding to the $1^{st}$ to $4^{th}$ sections 424-1 to 424-4 are recessed and filled in with respective metal patterns 461 for connection of the $2^{nd}$ replacement metal gate 425 with other circuit elements (not shown). A metal pattern filled in the section corresponding to the $1^{st}$ section 424-1 of the $2^{nd}$ dummy gate 424 connects the $2^{nd}$ replacement metal gate 425 with the part 415-1 of the $1^{st}$ replacement metal gate 415 filled in the hole 415H formed in the previous step of FIGS. 10A to 10C. This connection of the $1^{st}$ and $2^{nd}$ replacement metal gates 415 and 425 may be implemented for a transistor having a common gate such as an inverter circuit, but may be omitted in other circuits.

Next, a $1^{st}$ cap dielectric material 471 may be formed on the metal patterns 461 and planarized according to an embodiment.

FIGS. 12A to 12C illustrate two cross-sectional views and a top plan view of a semiconductor device, respectively, in which source/drain contact structures are formed, according to an embodiment.

FIG. 12A is a cross-sectional view of a semiconductor device 1200 taken along a line X-X' in FIG. 12C which is a top plan view of the semiconductor device 1200, and FIG. 12B is a cross-sectional view of a semiconductor device 1200 taken along a line Y-Y' in FIG. 12C. It is noted here that the lines X-X' and Y-Y' shown in FIG. 12C correspond to cross-sections at center lines of the semiconductor device 120 in the top plan view like the lines X-X' and Y-Y' of FIGS. 4C to 8C.

Referring to FIGS. 12A to 12C, the $1^{st}$ and $2^{nd}$ nanosheet layers 410C and 420C are now completely surrounded by the $1^{st}$ and $2^{nd}$ replacement metal gates 415 and 425, respectively, to build a $1^{st}$ nanosheet transistor 401 and a $2^{nd}$ nanosheet transistor 402. Further, $1^{st}$ to $4^{th}$ source/drain contact structures 421 to 424 are formed on the $1^{st}$ to $4^{th}$ source/drain regions 411 to 414, respectively, to connect the $1^{st}$ and $2^{nd}$ nanosheet transistors 401 and 402 to other circuit elements or power sources. In addition, a gate metal contact 462, a $2^{nd}$ cap dielectric material 472 and a gate contact structure 426 are formed above the $2^{nd}$ replacement metal gate 425. An additional ILD layer 443 is also formed to insulate the $2^{nd}$ source/drain contact structures 421, 422, and the gate contact structure 426 from one another.

The steps of manufacturing the multi-stack nanosheet structure for the semiconductor device 1200 in reference to FIGS. 4A-4C to FIGS. 12A-12C may not be performed in the aforementioned sequence. For example, although the $1^{st}$ and $2^{nd}$ replacement metal gates 415 and 425 are formed after the $1^{st}$ to $4^{th}$ source/drain regions 411 to 414 are formed, the $1^{st}$ and $2^{nd}$ replacement metal gates 415 and 425 may be formed before the $1^{st}$ to $4^{th}$ source/drain regions 411 to 414 are formed, according to embodiments. Further, the multi-stack nanosheet structure described above has the $1^{st}$ and $2^{nd}$ nanosheet stacks 410 and 420 with their channel sets perpendicularly crossing each other, the two channel sets may cross at different angles, according to embodiments.

Figure 13:
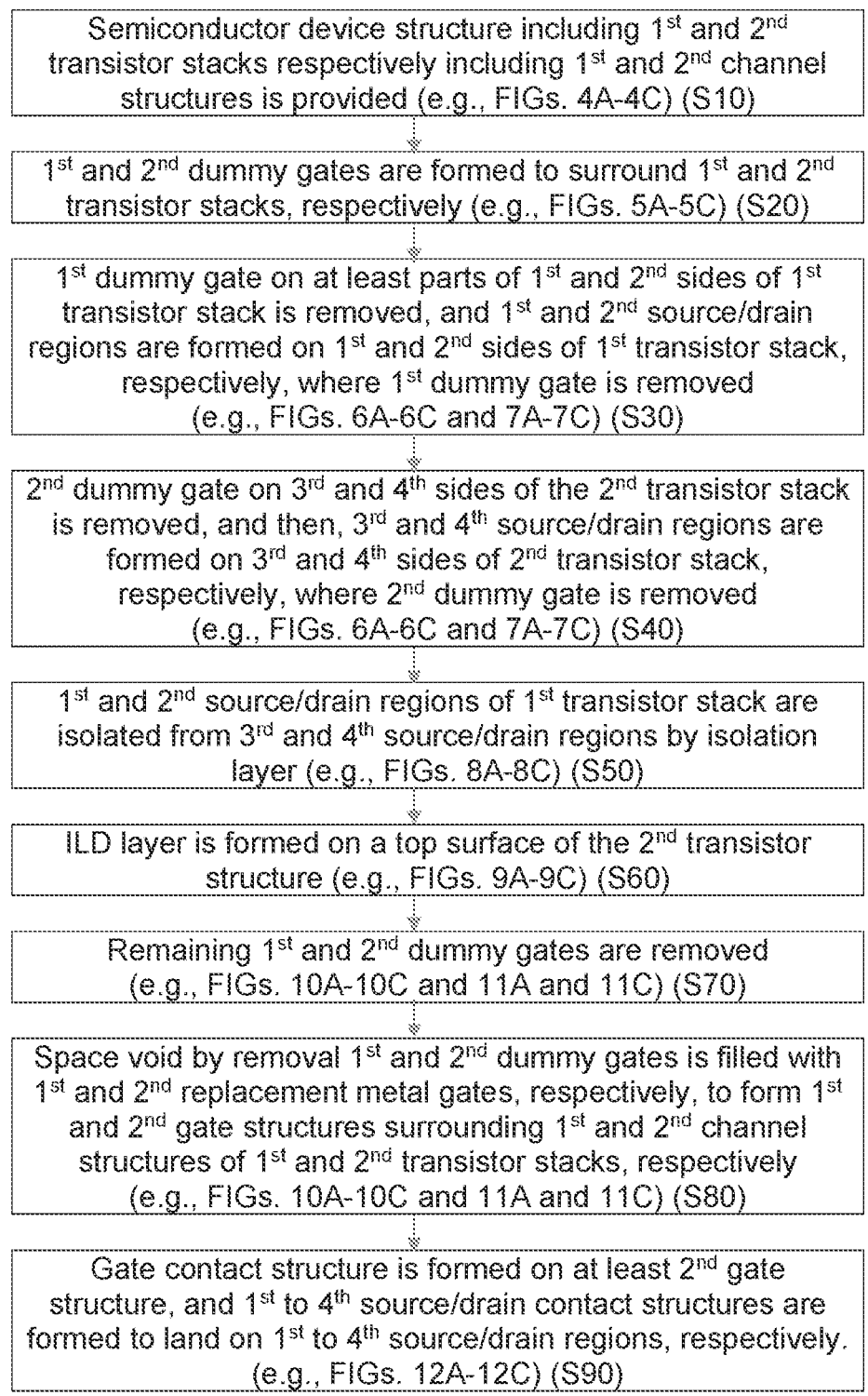
FIG. 13 illustrates a flowchart describing a method of manufacturing a semiconductor device having a multi-stack transistor structure in reference to FIGS. 4A-4C to 12A-12C, according to an embodiment.

Thus far, the inventive concept has been described with respect to manufacturing a multi-stack nanosheet structures. However, the inventive concept is not limited thereto, and instead, may apply to manufacturing different types of multi-stack transistor structures such as a hybrid multi-stack transistor structure in which an upper transistor stack may be a finFET stack or a nanosheet stack while a lower transistor stack is a nanosheet stack, according to embodiments FIG. 13 illustrates a flowchart describing a method of manufacturing a semiconductor device having a multi-stack transistor structure in reference to FIGS. 4A-4C to 12A-12C, according to an embodiment.

In operation S10, a semiconductor device structure including a substrate, a $1^{st}$ transistor stack formed on the substrate, and a $2^{nd}$ transistor stack formed on the $1^{st}$ transistor stack is provided, where the $1^{st}$ transistor stack may include a plurality of $1^{st}$ channel structures, and the $2^{nd}$ transistor stack may include a plurality of $2^{nd}$ channel structures (see, e.g., FIGS. 4A-4C).

In operation S20, a $1^{st}$ dummy gate is formed to surround the $1^{st}$ transistor stack, and a $2^{nd}$ dummy gate is formed on the $1^{st}$ dummy gate to surround the $2^{nd}$ transistor stack and a top surface of the $2^{nd}$ transistor stack (see, e.g., FIGS. 5A-5C).

In operation S30, the $1^{st}$ dummy gate on at least parts of at least $1^{st}$ and $2^{nd}$ sides among four sides of the $1^{st}$ transistor stack is removed, and $1^{st}$ and $2^{nd}$ source/drain regions are formed on the $1^{st}$ and $2^{nd}$ sides of the $1^{st}$ transistor stack, respectively, where the $1^{st}$ dummy gate is removed (see, e.g., FIGS. 6A-6C and 7A-7C).

In operation S40, the $2^{nd}$ dummy gate on at least parts of at least $3^{rd}$ and $4^{th}$ sides among four sides of the 2nd transistor stack is removed, and then, $3^{rd}$ and $4^{th}$ source/drain regions are formed on the $3^{rd}$ and $4^{th}$ sides of the $2^{nd}$ transistor stack, respectively, where the $2^{nd}$ dummy gate is removed (see, e.g., FIGS. 6A-6C and 7A-7C). Here, the $2^{nd}$ dummy gate may be removed before the $1^{st}$ dummy gate is removed, while the $1^{st}$ and $2^{nd}$ source/drain regions may be formed before the $3^{rd}$ and $4^{th}$ source/drain regions are formed (see, e.g., FIGS. 6A-6C and 8A-8C).

In operation S50, the $1^{st}$ and $2^{nd}$ source/drain regions of the $1^{st}$ transistor stack are isolated from the $3^{rd}$ and $4^{th}$ source/drain regions by an isolation layer (see, e.g., FIGS. 8A-8C).

In operation S60, an ILD layer is formed on a top surface of the $2^{nd}$ transistor structure (see, e.g., FIGS. 9A-9C).

In operation S70, the remaining $1^{st}$ and $2^{nd}$ dummy gates are removed (see, e.g., FIGS. 10A-10C and 11A and 11C). At this time, the $1^{st}$ dummy gate may be first removed, and then, the $2^{st}$ dummy gate may be removed. Specifically, a hole may be formed at one of the at least one edge area of the $2^{nd}$ dummy gate to expose the $1^{st}$ dummy gate though the hole, and the $1^{st}$ dummy gate may be removed though the hole.

In operation S80, a space void by the removal of the $1^{st}$ and $2^{nd}$ dummy gates is filled out with $1^{st}$ and $2^{nd}$ replacement metal gates, respectively, to form $1^{st}$ and $2^{nd}$ gate structures surrounding the $1^{st}$ and $2^{nd}$ channel structures included in the $1^{st}$ and $2^{nd}$ transistor stacks, respectively (see, e.g., FIGS. 10A-10C and 11A and 11C). Specifically, the $1^{st}$ replacement metal gate may fill in the space through the hole formed in the previous operation to surround the $1^{st}$ channel structures to form the $1^{st}$ gate structure. This hole may also be filled with the $1^{st}$ replacement metal gate. And then, the $2^{nd}$ replacement metal gate may fill in the remaining space to surround the $2^{nd}$ channel structures to form the $2^{nd}$ gate structure. As a result of this operation, the $1^{st}$ to $4^{th}$ source/drain regions may be formed such that the $3^{rd}$ source/drain region does not overlap the $1^{st}$ source/drain region or the $2^{nd}$ source/drain region, and the $4^{th}$ source/drain region does not overlap the $1^{st}$ source/drain region or the $2^{nd}$ source/drain region.

In operation S90, a gate contact structure is formed on at least the $2^{nd}$ gate structure, and $1^{st}$ to $4^{th}$ source/drain contact structures are formed to land on the $1^{st}$ to $4^{th}$ source/drain regions, respectively. (see, e.g., FIGS. 12A-12C). By this method, the $1^{st}$ and $2^{nd}$ source/drain contact structures do not need to be bent to be connected to the $1^{st}$ and $2^{nd}$ source/drain regions, or do not need to land on side surfaces of the $1^{st}$ and source/drain regions, respectively. Instead, the $1^{st}$ to $4^{th}$ source/drain contact structures may be formed to land on top surfaces of the $1^{st}$ to $4^{th}$ source/drain regions, respectively, from a structure, such as an upper metal pattern, formed above the $2^{nd}$ transistor stack.

Figure 14A:
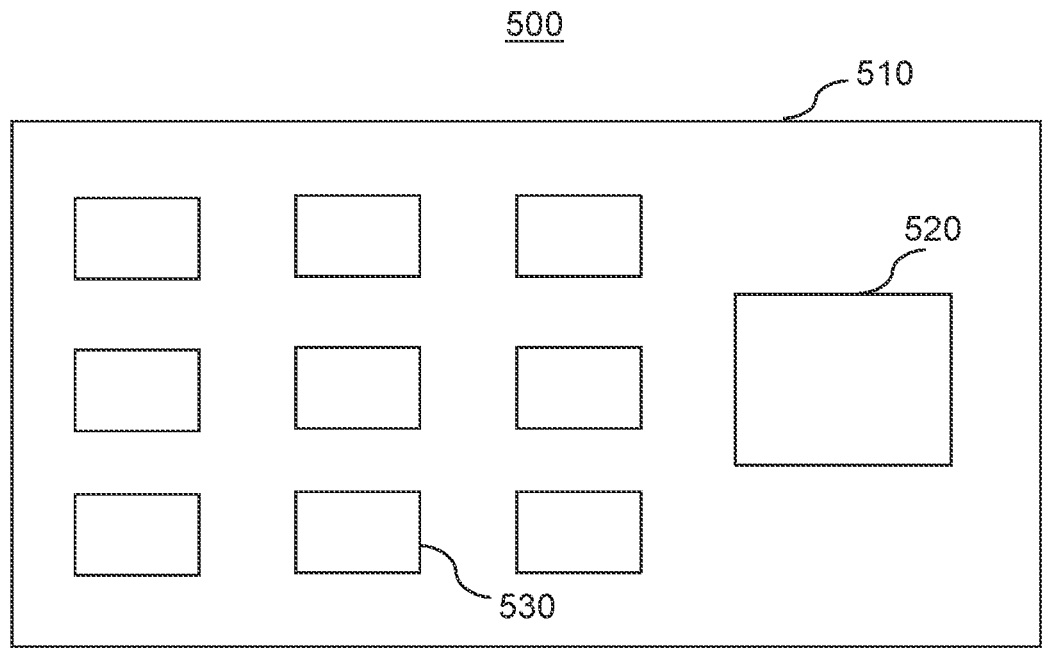
FIG. 14A illustrates a schematic plan view of a semiconductor module according to an embodiment.

FIG. 14A illustrates a schematic plan view of a semiconductor module according to an embodiment.

Referring to FIG. 14A, a semiconductor module 500 according to an embodiment may include a processor 520 and semiconductor devices 530 that are mounted on a module substrate 510. The processor 520 and/or the semiconductor devices 530 may include one or more multi-stack transistor structures described in the above embodiments.

Figure 14B:
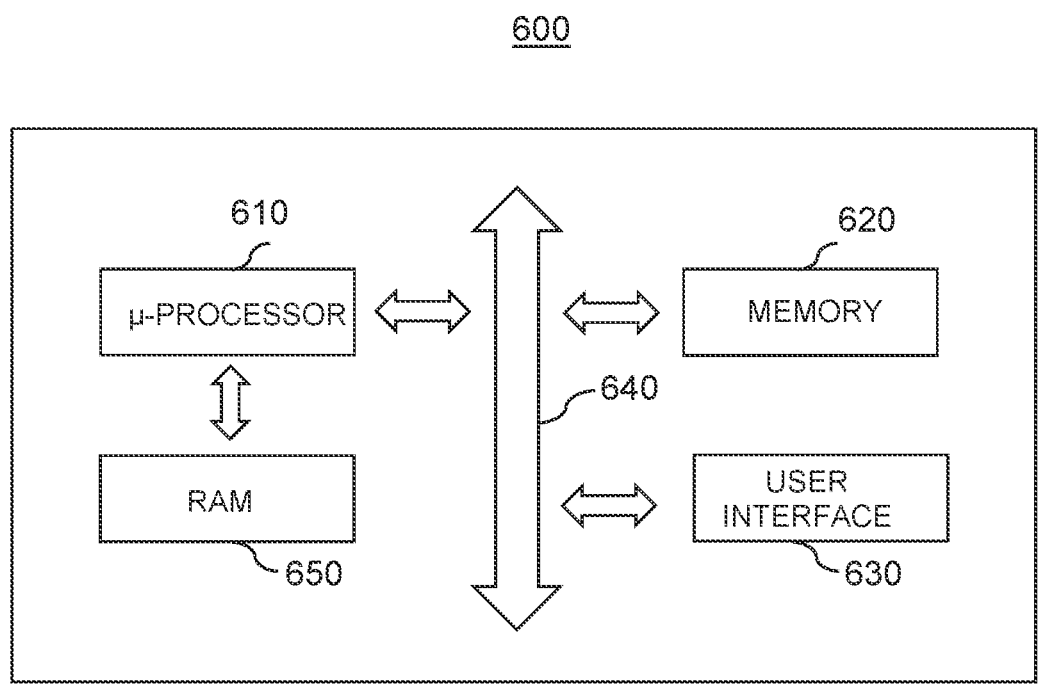
FIG. 14B illustrates a schematic block diagram of an electronic system according to an embodiment.

FIG. 14B illustrates a schematic block diagram of an electronic system according to an embodiment.

Referring to FIG. 14B, an electronic system 600 in accordance with an embodiment may include a microprocessor 610, a memory 620, and a user interface 630 that perform data communication using a bus 640. The microprocessor 610 may include a central processing unit (CPU) or an application processor (AP). The electronic system 600 may further include a random access memory (RAM) 650 in direct communication with the microprocessor 610. The microprocessor 610 and/or the RAM 650 may be implemented in a single module or package. The user interface 630 may be used to input data to the electronic system 600, or output data from the electronic system 600. For example, the user interface 630 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 620 may store operational codes of the microprocessor 610, data processed by the microprocessor 610, or data received from an external device. The memory 620 may include a memory controller, a hard disk, or a solid state drive (SSD).

At least the microprocessor 610, the memory 620 and/or the RAM 650 in the electronic system 600 may include one or more multi-stack transistor structures described in the above embodiments.

Due to the above-described crossing multi-stack transistor structures having different channel directions, a semiconductor device structure may dispense with bent source/drain contact structures for lateral connection to source/drain regions of a lower-stack transistor structure, thereby enabling easier manufacturing of the semiconductor device structure having source/drain contact structures landing on top surfaces of corresponding source/drain regions. In addition, the disclosed structure enables reduction of parasitic capacitance between source/drain regions of a lower-stack (upper-stack) transistor structure and source/drain contact structures of a upper-stack (lower-stack).

The foregoing is illustrative of exemplary embodiments and is not to be construed as limiting thereof. For example, one or more steps described above for manufacturing a supervia may be omitted to simplify the process. Although a few exemplary embodiments have been described, those skilled in the art will readily appreciate that many modifications are possible in the above embodiments without materially departing from the inventive concept.

What is claimed is:

1. A semiconductor device comprising:
   a substrate;
   a $1^{st}$ transistor formed above the substrate, comprising at least one $1^{st}$ channel structure, a $1^{st}$ gate structure surrounding the $1^{st}$ channel structure, and $1^{st}$ and $2^{nd}$ source/drain regions at both ends of the $1^{st}$ channel structure in a $1^{st}$ channel length direction; and
   a $2^{nd}$ transistor formed above the $1^{st}$ transistor in a vertical direction, comprising at least one $2^{nd}$ channel structure, a $2^{nd}$ gate structure surrounding the $2^{nd}$ channel structure, and $3^{rd}$ and $4^{th}$ source/drain regions at both ends of the $2^{nd}$ channel structure in a $2^{nd}$ channel length direction,
   wherein the $3^{rd}$ source/drain region vertically overlaps neither the $1^{st}$ source/drain region nor the $2^{nd}$ source/drain region, and the $4^{th}$ source/drain region vertically overlaps neither the $1^{st}$ source/drain region nor the $2^{nd}$ source/drain region, and
   wherein the $2^{nd}$ channel structure substantially overlaps the $1^{st}$ channel structure in a vertical direction.

2. The semiconductor device of claim 1 further comprising:
   a gate contact structure connected to at least the $1^{st}$ gate structure; and
   $1^{st}$ to $4^{th}$ source/drain contact structures extended straight downward from a metal layer to be connected the $1^{st}$ to $4^{th}$ source/drain regions, respectively.

3. The semiconductor device of claim 2, wherein at least the $1^{st}$ and $2^{nd}$ source/drain contact structure land on top surfaces of the $1^{st}$ and $2^{nd}$ source/drain regions.

4. The semiconductor device of claim 1, wherein the $2^{nd}$ transistor comprises at least one fin structure at the $2^{nd}$ channel structure, and
   wherein the $1^{st}$ transistor comprises a plurality of nanosheet layers at the $1^{st}$ channel structure.

5. The semiconductor device of claim 1, wherein a channel width of the $1^{st}$ channel structure is equal to a channel length of the $2^{nd}$ channel structure.

6. The semiconductor device of claim 1, wherein the $1^{st}$ and $2^{nd}$ channel length directions are different from each other.

7. The semiconductor device of claim 1, wherein a part of the $1^{st}$ gate structure is extended above the $1^{st}$ gate structure of the $1^{st}$ transistor to a side of the $2^{nd}$ gate structure of the $2^{nd}$ transistor to be disposed next to the $2^{nd}$ gate structure.

8. A transistor structure comprising a $1^{st}$ transistor and a $2^{nd}$ transistor formed above the $1^{st}$ transistor,
   wherein the $1^{st}$ transistor comprises at least one $1^{st}$ channel structure surrounded by a $1^{st}$ gate structure, and the $2^{nd}$ transistor comprises at least one $2^{nd}$ channel structure surrounded by a $2^{nd}$ gate structure,
   wherein the $1^{st}$ channel structure is configured to form at least one $1^{st}$ channel for a $1^{st}$ current flow in the $1^{st}$ channel length direction, and the $2^{nd}$ channel structure are configured to form at least one $2^{nd}$ channel for a $2^{nd}$ current flow in the $2^{nd}$ channel length direction, and
   wherein the $1^{st}$ and $2^{nd}$ channel length directions are different from each other, and
   wherein a channel width of the $1^{st}$ channel structure is equal to a channel length of the $2^{nd}$ channel structure.

9. The transistor structure of claim 8, wherein the $1^{st}$ transistor comprises a plurality of $1^{st}$ nanosheet layers as the $1^{st}$ channel structure, and
   wherein the $2^{nd}$ transistor comprises at least one fin structure as the $2^{nd}$ channel structure.

10. The transistor structure of claim 8, wherein the $1^{st}$ transistor further comprises $1^{st}$ and $2^{nd}$ source/drain regions, and the $2^{nd}$ transistor further comprises $3^{rd}$ and $4^{th}$ source/drain regions, and
    wherein the $3^{rd}$ source/drain region does not vertically overlap the $1^{st}$ source/drain region or the $2^{nd}$ source/drain region, and the $4^{th}$ source/drain region does not vertically overlap the $1^{st}$ source/drain region or the $2^{nd}$ source/drain region.

11. The transistor structure of claim 8, wherein a part of the $1^{st}$ gate structure is extended above the $1^{st}$ transistor to a side of the $2^{nd}$ gate structure of the $2^{nd}$ transistor to be disposed next to the $2^{nd}$ gate structure.

* * * * *